(12) United States Patent
Ide et al.

(10) Patent No.: US 7,829,907 B2
(45) Date of Patent: Nov. 9, 2010

(54) ORGANIC LIGHT EMITTING ELEMENT AND METHOD OF MANUFACTURING THE SAME

(75) Inventors: Nobuhiro Ide, Yonezawa (JP); Takuya Komoda, Sanda (JP); Junji Kido, c/o Matsushita Electric Works, Ltd., 1048, Oaza-Kadoma, Kodoma-shi, Yonezawa (JP)

(73) Assignees: Panasonic Electric Works Co., Ltd., Osaka (JP); Junji Kido, Yonezawa-shi (JP)

( * ) Notice: Subject to any disclaimer, the term of this patent is extended or adjusted under 35 U.S.C. 154(b) by 378 days.

(21) Appl. No.: 12/067,718

(22) PCT Filed: Sep. 21, 2006

(86) PCT No.: PCT/JP2006/318719

§ 371 (c)(1),
(2), (4) Date: Mar. 21, 2008

(87) PCT Pub. No.: WO2007/043299

PCT Pub. Date: Apr. 19, 2007

(65) Prior Publication Data

US 2009/0230415 A1    Sep. 17, 2009

(30) Foreign Application Priority Data

Sep. 22, 2005    (JP) .............................. 2005-276861

(51) Int. Cl.
*H01L 33/00* (2010.01)
(52) U.S. Cl. .................. 257/98; 257/89; 257/E33.064; 313/498; 438/29
(58) Field of Classification Search .................. 257/98, 257/89, E33.064; 313/498, 504, 506; 438/29
See application file for complete search history.

(56) References Cited

U.S. PATENT DOCUMENTS 5,917,280 A    6/1999    Burrows et al.

(Continued)

FOREIGN PATENT DOCUMENTS

JP    11-329748    11/1999

(Continued)

OTHER PUBLICATIONS

English language Abstract of JP 2004-31214, Jan. 2004.

(Continued)

*Primary Examiner*—Mark Prenty
(74) *Attorney, Agent, or Firm*—Greenblum & Bernstein, P.L.C.

(57) ABSTRACT

The present invention relates to an organic light emitting element comprising: a first light emitting unit comprising a light emitting layer between a pair of electrodes; and a second light emitting unit comprising a light emitting layer between a pair of electrodes. In the organic light emitting element, one electrode of the two pairs of electrodes which is positioned on the outermost side has light reflective properties, and the other electrodes have light transmission properties, while a light-transmitting insulating layer is provided between the first and second light emitting units. The insulating layer is formed in a thickness to prevent light emitted by the light emitting layer of the light emitting unit without the light reflective electrode from interfering with other lights, or formed to have properties of scattering the emitted light. Thus, the interference between the lights emitted by the light emitting layers and the other lights is reduced, so that in the organic light emitting element, the angular dependence of light emission spectrum is small, making it possible to adjust color.

15 Claims, 13 Drawing Sheets

U.S. PATENT DOCUMENTS

| | | | |
|---|---|---|---|
| 7,714,504 B2 * | 5/2010 | Forrest et al. | 313/504 |
| 2004/0201027 A1 | 10/2004 | Ghosh | |

FOREIGN PATENT DOCUMENTS

| | | |
|---|---|---|
| JP | 2000-323277 | 11/2000 |
| JP | 2001-511296 | 8/2001 |
| JP | 2002-43054 | 2/2002 |
| JP | 2002-260859 | 9/2002 |
| JP | 2003-36969 | 2/2003 |
| JP | 2003-272860 | 9/2003 |
| JP | 2004-31214 | 1/2004 |
| JP | 2004-319484 | 11/2004 |
| JP | 2006-155940 | 6/2006 |

OTHER PUBLICATIONS

English language Abstract of JP 2002-260859, Sep. 2002.
English language Abstract of JP 2004-319484, Nov. 2004.
English language Abstract of JP 2002-43054, Feb. 2002.
English language Abstract of JP 2006-155940, Jun. 2006.
English language Abstract of JP 11-329748, Nov. 1999.
English language Abstract of JP 2000-323277, Nov. 2000.
English language Abstract of JP 2003-272860, Sep. 2003.
Horii et al., "White Multi-Photon Emission OLED without Optical Interference," In: Society for Information Display, IDW '04 Proceedings of the 11th International Display Workshops. Dec. 8, 2004, pp. 1293-1296.
Official Action of Korean Patent Application No. 2008-7008713, mailed Sep. 30, 2009, along with an English language translation thereof.

* cited by examiner

ORGANIC LIGHT EMITTING ELEMENT AND METHOD OF MANUFACTURING THE SAME

TECHNICAL FIELD

The present invention relates to an organic light emitting element and a method of manufacturing the same which is used in a flat display panel, or as a light source for a backlight for a liquid crystal display apparatus, or for illumination, and so on.

BACKGROUND ART

An example of a known organic light emitting element, which is called organic electroluminescence element (organic EL element), is formed by stacking a transparent electrode as an anode, a hole transport layer, an organic light emitting layer, an electron injection layer, and an electrode as a cathode in this order on the surface of one side of a transparent substrate. When a voltage is applied between the anode and the cathode, electrons injected into the light emitting layer through the electron injection layer and holes injected into the light emitting layer through the hole transport layer are recombined in the light emitting layer to generate an excited state, thereby causing light emission. The light emitted by the light emitting layer is emitted outside the element through the transparent electrode and the transparent substrate.

An organic light emitting element has features, for example, that it is of spontaneous light emission, and shows light emission characteristics of relatively high efficiency, and further can emit light in various colors. For example, it is expected to be used as a light emitter in a display device of e.g. flat panel display, or as a light source for a backlight for a liquid crystal display apparatus, or for illumination, and so on. It has already been put to practical use in some. However, an organic light emitting element has a tradeoff between brightness and life, and has properties such that an increase in brightness to obtain a sharper image and brighter illumination light shortens its life.

A known organic light emitting element to solve the above-described problem is shown, for example, in Japanese Laid-open Patent Publication Hei 11-329748. In this organic light emitting element, a plurality of light emitting layers are provided between an anode and a cathode, and further a charge generation layer or an intermediate conducting layer which forms an equipotential surface is provided between respective ones of the light emitting layers.

As demonstrated in FIG. 16, an organic light emitting element 101 of this kind is formed by stacking a light-transmitting electrode 103 as an anode, a first light emitting layer 104, an intermediate conducting layer 105 forming an equipotential surface, a second light emitting layer 106, and a light reflective electrode 107 as a cathode in this order, respectively, on the surface of a transparent substrate 102. Note that although the light emitting layers 104, 106 respectively have a hole transport layer and an electron injection layer, their drawings are omitted in FIG. 16.

According to the structure described above, the plurality of light emitting layers 104, 106 are partitioned by the intermediate conducting layer 105, so that when a voltage is applied between the electrodes 103, 107, both light emitting layers 104, 106 are brought to a state in which they are essentially connected in series, thereby emitting light at the same time. As a result, the lights from the respective light emitting layers 104, 106 are put together, so that the organic light emitting element 101 can emit light with a higher brightness than a conventional organic light emitting element with a single light emitting layer, despite the tradeoff between brightness and life.

However, an organic light emitting element has problems such as reduction in light use efficiency as well as view angle dependence and film thickness dependence of light emission brightness and light emission spectrum, which occur more noticeably in an organic light emitting element with a plurality of light emitting layers as described above. These problems are caused e.g. by light interference effect or total reflection which causes a phenomenon of light confinement in high refractive index media such as the organic light emitting layer, the substrate and the electrodes. These in turn are caused e.g. by that the organic light emitting element is a thin film device which has a film thickness in an order of magnitude of an optical wavelength, and which has therein a reflective surface composed of e.g. a refractive index step or a metal surface, or which has a high refractive index medium to generate light.

The light interference effect, if used properly, makes it possible to increase color purity and control directivity, and is particularly useful for uses such as flat panel display. For example, according to Japanese Laid-open Patent Publication 2000-323277, the film formation of organic material layers including a light emitting layer is performed such that the optical path length between a light emitting layer and a light reflective electrode is set equal to an odd multiple of ¼ wavelength of wavelength $\lambda$ of the emitted light, or such that the optical path length between a light emission position and a maximum refractive index step position is set equal to an even multiple of ¼ wavelength of the wavelength $\lambda$, making it possible to emphasize the light with the wavelength $\lambda$. In particular, it is known that the optical path length between a light emitting layer and a light reflective electrode has a significant influence on the light emission spectrum. Further, Japanese Laid-open Patent Publication 2003-272860 shows that light emission of highest efficiency can be obtained, and the shape of a light emission spectrum becomes thin, by allowing an optical film thickness from a light emission position of each of a plurality of light emitting layers to a light reflective electrode to be equal to an odd multiple of ¼ wavelength of wavelength $\lambda$ of the emitted light.

However, the light emission brightness and the light emission color vary significantly with a variation in the film thickness of the organic light emitting element whose color purity and so on are modified by optimizing the film thickness of the element such as the optical path length between the light emitting layer and the light reflective electrode, and the optical path length between the light emitting layer and the maximum refractive index step position as described above. This means that the film thickness tolerance, when manufacturing the organic light emitting element, is small, resulting in a risk that the manufacturing efficiency may be reduced. In particular, in an organic light emitting element formed by stacking a plurality of light emitting layers, an equipotential surface forming layer, a charge generation layer, and so on as described above, a slight deviation in optical properties (anomaly in film thickness and refractive index) occurring in one layer has a profound influence on the optical positions of the other layers, so that a highly accurate film thickness control is required, resulting in a risk of a high cost.

Further, in the light emitting element shown in the above-described Japanese Laid-open Patent Publication 2003-272860, it is preferable from the viewpoint of efficiency that the optical path length between the light emitting layer and the light reflective electrode is set equal to an odd multiple (2n+1) [n=0, 1, 2 . . . ] of ¼ wavelength of wavelength λ of the emitted light. However, actually, the angular dependence of the brightness and spectrum increases with an increase in the value of n. More specifically, the film thickness of an organic light emitting element with a single light emitting layer is designed to correspond an optical path length which substantially corresponds to n=0, so that the light emission brightness and the light emission color do not necessarily vary significantly with a variation in the film thickness. However, in an organic light emitting element comprising a plurality of light emitting layers as described above, each of the light emitting layers is provided at a position corresponding to a (2n+1) [n=0, 1, 2 . . . ] multiple of ¼ wavelength of the wavelength λ of the emitted light. Accordingly, an increase in the number of layers causes a specific wavelength to be noticeably emphasized, causing a certain light emitting layer to emit light of a different spectrum from its intrinsic spectrum, and also causing its angular dependence to increase. Thus, the organic light emitting element comprising the plurality of light emitting layers as described above does not have desirable properties with respect to the light emission spectrum and the view angle dependence, although it can achieve higher current efficiency and quantum efficiency than the conventional type organic light emitting element.

On the other hand, in the organic light emitting element having the structure shown in FIG. 16, the respective ones of the plurality of light emitting layers are connected in series, and the same current is supplied to the respective light emitting layers, so that essentially it is not possible to individually control the light emission colors of the respective light emitting layers. By selectively designing predetermined respective light emitting layers when manufacturing an organic light emitting element, it is possible to obtain an organic light emitting element in which the respective light emitting layers emit light with individual colors. However, it is not possible to change once-determined light emission colors. If a plurality of light emitting layers which present respective colors of RGB are stacked, for example, then white color is obtained by combining the light emission colors. However, if the behaviors of light emission properties of the respective light emitting layers to the brightness are different, it may not be possible to obtain desired white light due to changes in the light emission color between brightnesses. In addition, if the lives of the plurality of light emitting layers are different, it may occur that the light emission color of light emitting layer with a short life gradually decreases, causing a color deviation. For example, if the organic light emitting element having the structure described above is used as a light emission source of a display, a deviation may occur in the color balance of a displayed light emission color. Further, if the organic light emitting element described above is used as a light source for illumination, the degradation is viewed and recognized as a color deviation, which is particularly undesirable.

Besides, Published Japanese Translation of PCT Application 2001-511296 proposes a stacked type organic light emitting element formed by stacking a plurality of light emitting layers having electrodes. This organic light emitting element has a structure such that a plurality of light emitting layers with independent or partially common electrodes are stacked, if necessary via insulating layers, and is usable for display use. However, the organic light emitting element with this structure has a short distance between the light emitting layers, so that it does not solve the problem of the light interference described above. In fact, Published Japanese Translation of PCT Application 2001-511296 proposes an element design in which the positions of the respective light emitting layers are set based on their light emission wavelengths on the premise of the existence of light interference, so as to enable light emission with high color purity. However, this element design also uses such film thickness as to cause the distance between a light emitting layer and a light reflective layer to emphasize light with a predetermined wavelength, so that particularly in the case of stacked light emitting layers, the problem of the angular dependence of the light emission wavelength is not solved.

DISCLOSURE OF INVENTION

The present invention solves the above-described problems, and its object is to provide an organic light emitting element which has a small angular dependence of the light emission spectrum, making it possible to achieve high quality light emission showing light emission of a desired color regardless of the angle, and which makes it possible to adjust the color.

In order to solve the problems described above, the present invention provides an organic light emitting element comprising a first light emitting unit having a light emitting layer between a pair of electrodes, and a second light emitting unit having a light emitting layer between a pair of electrodes, wherein: one electrode of the four electrodes of the first and second light emitting units, which is positioned on the outermost side, has light reflective properties while the other electrodes have light transmission properties; a light-transmitting insulating layer is provided between the first and second light emitting units; and the insulating layer is formed in a thickness to prevent light emitted by the light emitting layer of the light emitting unit without the light reflective electrode from interfering with other lights, or formed to have properties of scattering the light emitted by the same light emitting layer.

According to the organic light emitting element of the present invention, the interference between the light emitted by the light emitting layer and lights reflected by the reflective surface is reduced, so that the angular dependence of light emission spectrum becomes small, making it possible to achieve high quality light emission showing light emission of a desired color regardless of the angle. Further, due to the provision of the light-transmitting insulating layer between the first light emitting unit and the second light emitting unit, both light emitting units are electrically disconnected, allowing the respective light emitting units to be driven independently. Thus, the organic light emitting element of the present invention can change the light emission properties of each light emitting unit, if necessary, making it possible to adjust the color.

Further, the organic light emitting element of the present invention can be designed so that the four electrodes of the first and second light emitting units have light transmission properties, while a light reflective layer having light reflective properties is provided on an outer side of one of the electrodes which is positioned on the outermost side; a light-transmitting insulating layer is provided between the first and second light emitting units; and the insulating layer is formed in a thickness to prevent light emitted by the light emitting layer of the light emitting unit without the light reflective layer from interfering with other lights, or formed to have properties of scattering the light emitted by the same light emitting layer.

Furthermore, it can be designed so that a light-transmitting insulating layer is provided on an outer side of one of the electrodes which is positioned on the outermost side, with a reflective layer having light reflective properties on an outer side of the insulating layer; and the insulating layer is formed in a thickness to prevent light emitted by the light emitting layer of the light emitting unit without the light reflective layer from interfering with other lights, or formed to have properties of scattering the light emitted by the same light emitting layer.

Preferably, at least one of the first and second light emitting units has a plurality of light emitting layers, the plurality of light emitting layers being stacked via an equipotential surface forming layer or a charge generation layer. More effectively, the insulating layer is formed of a glass plate or a film.

Further preferably, the organic light emitting element of the present invention is manufactured by a method of manufacturing the organic light emitting element which includes: a step of forming one of the first and second light emitting units in a manner that one material of a light transmitting material formed in a thickness to prevent the light emitted by the light emitting layer from interfering with the other lights, or a light transmitting material formed to have properties of scattering the light emitted by the light emitting layer, is prepared as a first substrate, and that an electrode, a light emitting layer and an electrode are stacked in this order on a surface of the first substrate, a step of forming the other of the first and second light emitting units in a manner that a light transparent material is prepared as a second substrate, and that an electrode, a light emitting layer and an electrode are stacked in this order on a surface of the second substrate, and a step of stacking the first and second light emitting units via the first substrate in a manner that the light emitting unit formed on the second substrate is stacked on the first substrate.

The organic light emitting element of the present invention can be appropriately manufactured by a method of manufacturing the organic light emitting element which includes: a step of forming one of the first and second light emitting units in a manner that one material of a light transmitting material formed in a thickness to prevent the light emitted by the light emitting layer from interfering with the other lights, or a light transmitting material formed to have properties of scattering the light emitted by the light emitting layer, is prepared as a substrate, and that an electrode, a light emitting layer and an electrode are stacked in this order on a surface of the substrate, and a step of forming the other of the first and second light emitting units in a manner that an electrode, a light emitting layer and an electrode are stacked in this order on a surface of the substrate without the one of the first and second light emitting units formed thereon.

BRIEF DESCRIPTION OF DRAWINGS

FIG. 7A is a plan view of an ITO-attached glass base plate to be used for manufacturing organic light emitting elements of Examples of the present invention, while

FIG. 13B is a graph showing variations in front emission spectra when the emission intensity ratio was variously changed, while

FIG. 14B is a graph variations in emission spectra when a white light emitting element and a red light emitting element of the same were driven at arbitrary current ratios, while

BEST MODE FOR CARRYING OUT THE INVENTION

Figure 1A:
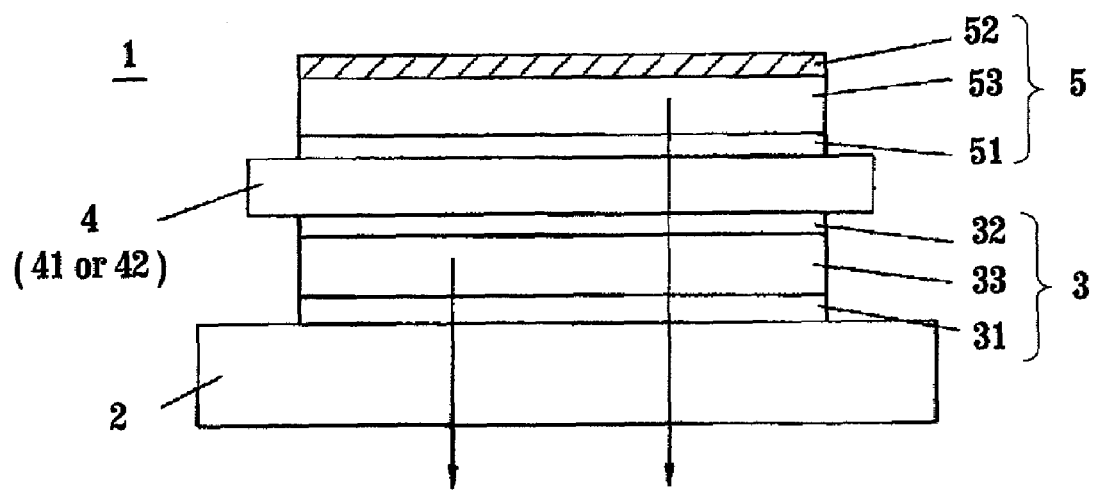
FIGS. 1A and 1B are side views each showing an example of a structure of an organic light emitting element according to a first embodiment of the present invention.

Hereinafter, an organic light emitting element according to a first embodiment of the present invention will be described with reference to FIG. 1A. An organic light emitting element 1 (organic EL light emitting element) comprises a first light emitting unit 3, a light-transmitting insulating layer 4, and a second light emitting unit 5 which are stacked in this order on a substrate 2. The first light emitting unit 3 is formed by stacking a first light emitting layer 33 between two, first and second, electrodes 31, 32, in which one of the first and second electrodes 31, 32 serves as an anode, and the other as a cathode. Further, the second light emitting unit 5 is formed by stacking a second light emitting layer 53 between two, third and fourth, electrodes 51, 52, in which one of the third and fourth electrodes 51, 52 serves as an anode, and the other as a cathode, similarly as in the electrodes 31, 32. Here, among the first to fourth electrodes 31, 32, 51, 52, either the first electrode 31 positioned on the outside of the first light emitting unit 3 or the fourth electrode 52 positioned on the outside of the second light emitting unit 5 is formed as a light reflective electrode, while the other electrode is formed to have light transmission properties.

For example, if in the organic light emitting element 1, lights emitted by the light emitting layers 33, 53 are irradiated from the side of the substrate 2 as shown by arrows in FIG. 1A, the substrate 2 is formed as a light transmitting substrate made e.g. of a transparent resin plate or a transparent resin sheet. The first electrode 31, the second electrode 32 and the third electrode 51 are also formed as light transmitting electrodes, while the fourth electrode 52 is formed as a light reflective electrode.

The first and second light emitting layers 33, 53 are organic layers made of publicly known and arbitrary structure and composition material, and are each formed, for example, as a light emitting layer to emit light by a single material, which is a so-called doping type light emitting layer of a host material having a dopant introduced therein, or as a light emitting layer formed of two or more layers which are made of materials with different compositions, and which are stacked or placed side by side. If necessary, a hole transport layer, a hole injection layer, an electron transport layer, an electron injection layer, a carrier blocking layer and the like are stacked between the respective light emitting layers 33, 53 and the electrodes 31, 32, 51, 52. However, the showing of these respective layers is omitted in FIG. 1A (this also applies to the drawings described below).

The material of the light transmitting electrodes among the electrodes 31, 32, 51, 52 is not particularly limited if it does not damage the function of the organic light emitting element, but uses a transparent conductive film such as ITO, IZO, AZO, GZO, ATO and $SnO_2$, a thin metal film such as Ag, Au and Al, a conductive organic material film, or a multilayer film formed by appropriately combining these. The light transmitting electrode is preferably formed of a material having a high light transmission. Further, it is desirable that the reflectance of an interface between the light transmitting electrode and a layer adjacent thereto, and/or of the electrode itself, is preferably low. For example, between the light transmitting electrode and the layer (including an air layer) adjacent to the light transmitting electrode, a so-called anti-reflection layer or a film having an intermediate refractive index between the two is provided to reduce the reflectance of the interface between the light transmitting electrode and the layer adjacent thereto.

The light reflective electrode is not particularly limited, if it does not damage the function of the organic light emitting element and has sufficient light reflectance, but uses a metal electrode such as Al, Ag, Au, Ni, Cr and others, or an electrode formed by appropriately combining the above-described transparent conductive film with an arbitrary reflective film layer or conductive organic material such as a metal electrode and a dielectric multilayer film.

The light-transmitting insulating layer 4 is either a layer 41 formed in a thickness to prevent light emitted by the light emitting layer 33 positioned in the light irradiation direction from interfering with other lights, or a layer 42 formed to have properties of scattering light (light scattering properties) emitted by the light emitting layer 33. The insulating layer 4 uses, as a main component material, a glass plate, a light transmitting film or a similar light transmitting material such as a sheet/film or the like made of a resin plate, a plastic sheet, a composite of glass and plastic, a light transmitting ceramic plate, a cured resin body or an organic-inorganic hybrid material.

The layer 41 formed in a thickness to prevent light emitted by the light emitting layer 33 positioned in the light irradiation direction from interfering with other lights uses, for example: a light transmitting film formed by vapor deposition, sputtering, CVD or the like of $SiO_2$, SiO, SiN, LiF, $MgF_2$ or the like; a light transmitting film formed by an arbitrary coating method or printing method such as spin coating, dip coating, coating, ink jet, gravure, screen, or the like of an inorganic-based or organic-based resin or the like; a film formed by attaching or placing a sheet, a film, a gel, a seal, a plate or the like made of an organic-based or inorganic-based material; or the like. Further, the substrate itself to support the organic light emitting element can be used therefor. Note that generally the above-described thickness to prevent the light from causing interference can be an order of magnitude of few or more times the light emission wavelength, and, for example, is a thickness of about 1 μm to 3 mm.

Further, the layer 42 formed to have light scattering properties is manufactured in a manner: that the layer is allowed to contain a light scattering component such as foil or particles having a different refractive index from a main component material of the layer 42; that an interface formed by combining multiple materials having different refractive indices is formed within the layer 42, such as by using a material having irregularities on which to stack a separate material; that a material, which exhibits a light scattering effect by causing phase separation from the main component material of the layer 42, is combined therewith; or that the layer 42 is allowed to contain surface, foil, particles or the like having reflective properties. The film thickness of the layer 42 is not particularly limited, and is arbitrarily set as needed.

Figure 1B:
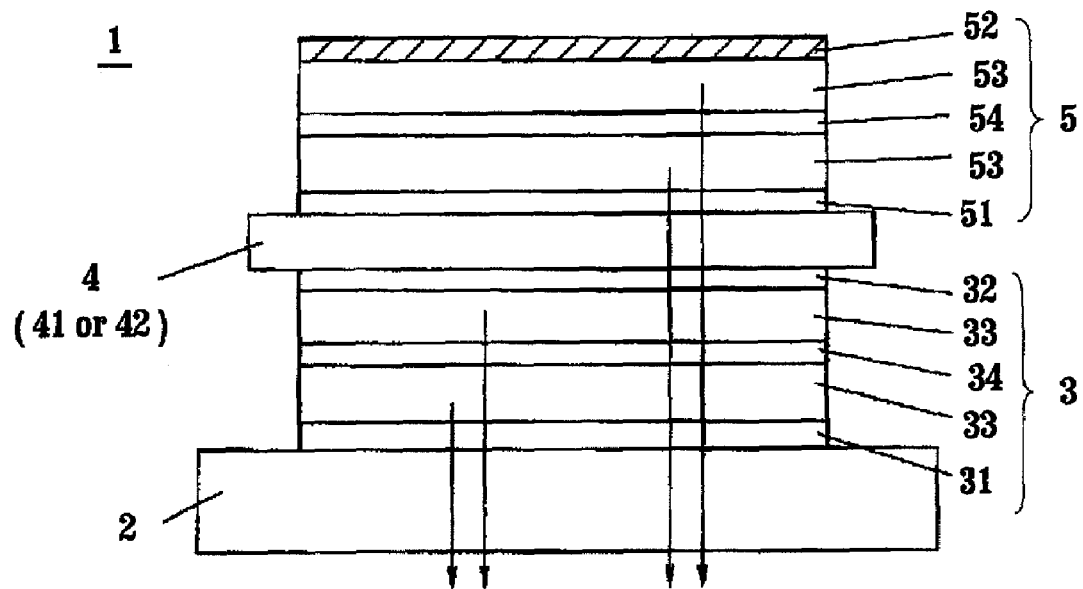

FIG. 1B shows a modified example of the organic light emitting element 1 of the present embodiment, in which light emitting units 3, 5 have pluralities of light emitting layers 33, 53 between the electrodes 31, 32 and the electrodes 51, 52, respectively, while equipotential surface forming layers 34, 54 or charge generation layers 34, 54 are stacked between these light emitting layers 33, 53, respectively, so as to form light emitting units 3, 5 of the so-called stacked type, tandem type or multiphoton type. Note that it is possible either that both light emitting units 3, 5 are formed of pluralities of light emitting layers 33, 53, or that only one of the light emitting units 3, 5 is formed of a plurality of light emitting layers 33, 53. The material of the equipotential surface forming layers 34, 54 or charge generation layers 34, 54 uses, for example: a metal thin film such as Ag, Au or Al; a metal oxide such as vanadium oxide, molybdenum oxide, rhenium oxide or tungsten oxide; a transparent conductive film such as ITO, IZO, AZO, GZO, ATO or $SnO_2$; a stacked body of so-called n-type semiconductor and p-type semiconductor; a stacked body a metal thin film or transparent conductive film and n-type semiconductor and/or p-type semiconductor; a mixture of n-type semiconductor and p-type semiconductor; a mixture of n-type semiconductor and/or p-type semiconductor and a metal; or the like. The n-type semiconductor and the p-type semiconductor can be either an inorganic-based material or an organic-based material, or can be a mixture of an organic-based material with a metal, or can also be a material formed by combining an organic-based material with a metal oxide, or an organic-based material with an organic-based acceptor/donor material, an inorganic-based acceptor/donor material or the like. Appropriate materials as needed are used.

Figure 2A:
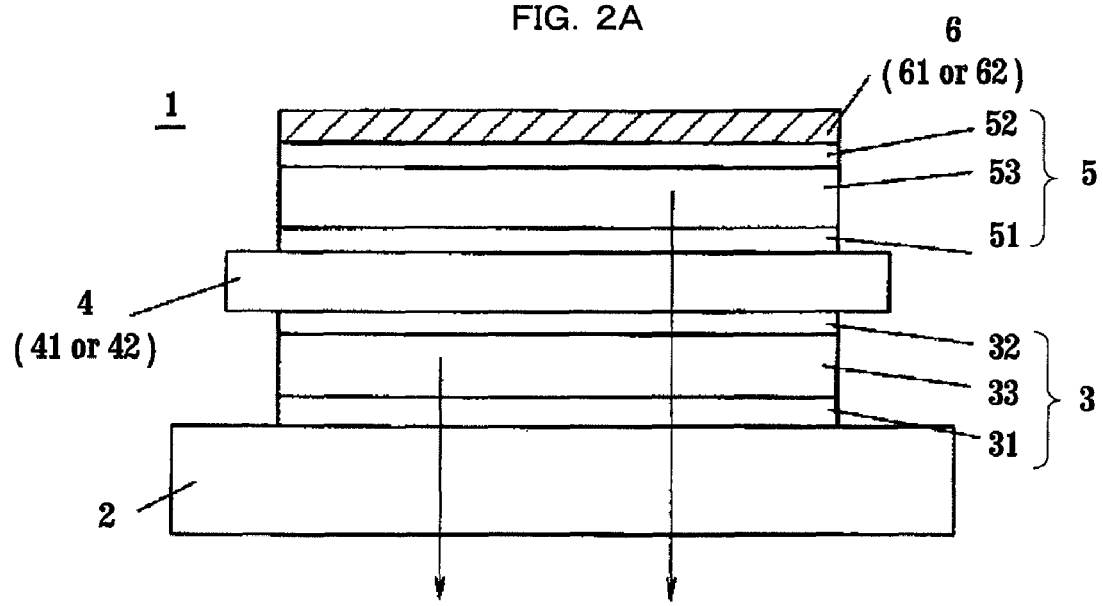
FIGS. 2A and 2B are side views each showing an example of a structure of an organic light emitting element according to a second embodiment of the present invention.

Referring next to FIG. 2A, an organic light emitting element according to a second embodiment of the present invention will be described. The organic light emitting element 1 of the present embodiment is different from the first embodiment in that the above-described first to fourth electrodes 31, 32, 51, 52 are formed as light transmitting electrodes, and that a light reflective layer 6 having light reflective properties is further stacked on an outer side of either the electrode 31 positioned on the outside of the first light emitting unit 3 or the fourth electrode 52 positioned on the outside of the second light emitting unit 5. Note that FIG. 2A shows an example in which the light reflective layer 6 having light reflective properties is stacked on an outer side of the fourth electrode 52 so as to allow light to be irradiated from the side of the substrate 2 as shown by arrows.

Figure 2B:
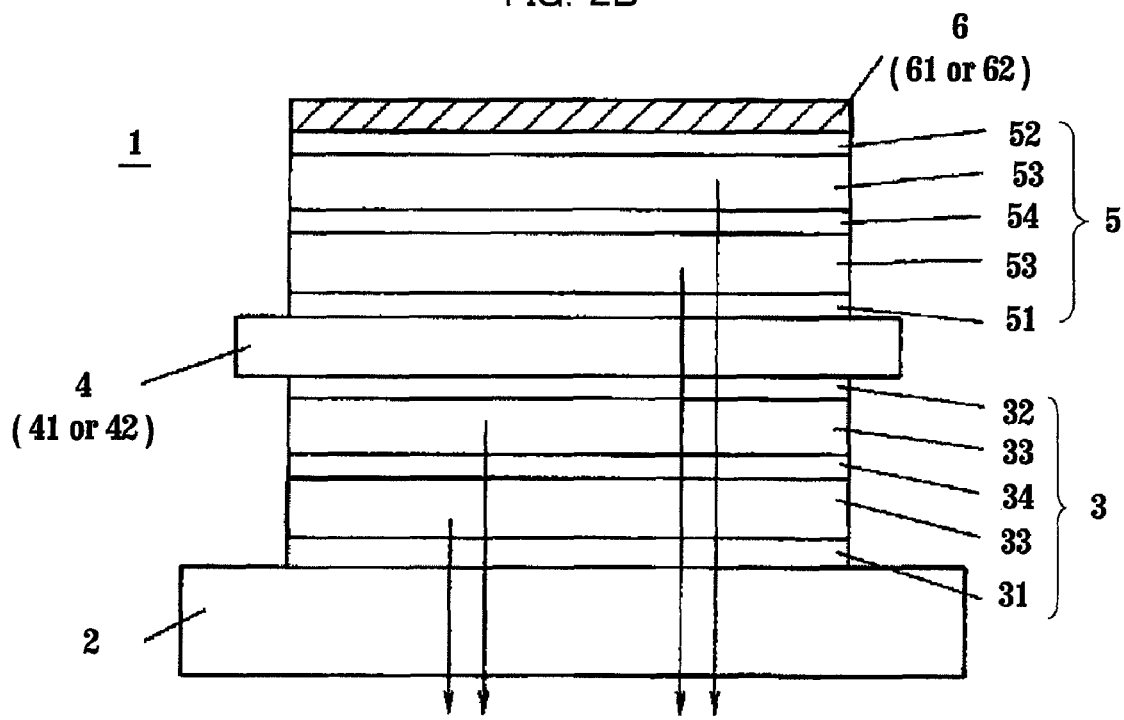

The light reflective layer 6 formed on an outer side of the electrode 52 can be a layer 61 having reflective properties of the so-called mirror surface, or can be a layer 62 having light scattering properties or diffusive reflection properties. The light reflective layer 61 having the reflective properties of the mirror surface uses a reflective film made of an arbitrary reflector material, which essentially shows a reflection of the mirror surface, such as e.g. a metal film e.g. of Al or Ag, or a reflective film made of a dielectric multilayer film. Further, the light reflective layer 62 having the light scattering properties or the diffusive reflection properties uses, for example: a reflective film made of a layer of particles of barium oxide, titanium oxide or the like; a reflective film made of a metal film or a dielectric multilayer film and formed on an irregular-shaped surface; or a reflective film formed by forming, on a reflective film having reflective properties of the mirror surface, a film made of a light transmitting material having light scattering properties, light diffusion properties or diffraction properties. Note that similarly as in FIG. 1B, FIG. 2B shows a modified example of the present embodiment, in which the light emitting units 3, 5 comprise pluralities of light emitting layers 33, 53, respectively, while equipotential surface forming layers 34, 54 or charge generation layers 34, 54 are stacked between the light emitting layers 33, 53, respectively.

Figure 3A:
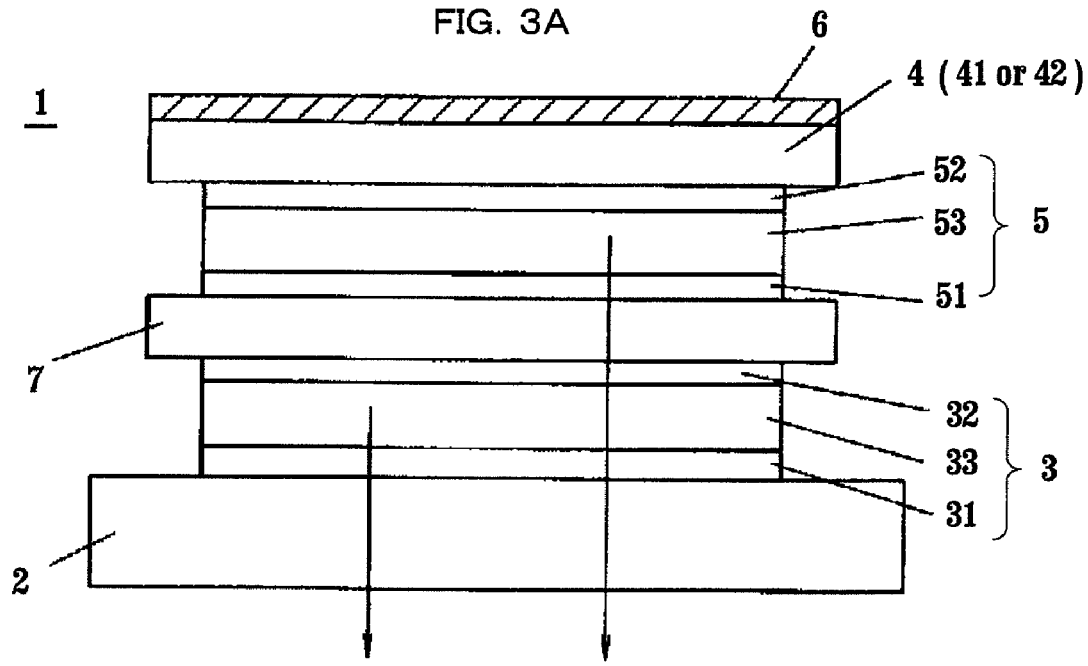
FIGS. 3A and 3B are side views each showing an example of a structure of an organic light emitting element according to a third embodiment of the present invention.

Referring next to FIG. 3A, an organic light emitting element according to a third embodiment of the present invention will be described. The organic light emitting element 1 of the present embodiment is different from the organic light emitting element 1 of the second embodiment in that an insulating layer 7 is provided between first and second light emitting units 3, 5, and that a light-transmitting insulating layer 4 is further stacked on an inner side of the light reflective layer 6, and on an outer side of either the electrode 31 positioned on the outside of the first light emitting unit 3 or the fourth electrode 52 positioned on the outside of the second light emitting unit 5. Note that FIG. 3A shows an example in which the insulating layer 4 and the light reflective layer 6 are stacked on an outer side of the fourth electrode 52 so as to allow light to be irradiated from the side of the substrate 2.

In the present embodiment, the light-transmitting insulating layer 4 is either a layer 41 formed in a thickness to prevent lights emitted by the light emitting layers 33, 53 from interfering with other lights, or a layer 42 formed to have properties of scattering lights emitted by the light emitting layers 33, 53. However, the insulating layer 7 is provided as needed, and is not a requisite.

The light transmitting electrodes 31, 32, 51, 52, the light emitting layer 33 and the light-transmitting insulating layer 4 use the same materials as the materials of the first and second embodiments. Further, the thickness of the light-transmitting insulating layer 7 between the first light emitting unit 3 and the second light emitting unit 5 is not particularly limited, and the presence/absence of the light scattering properties does not matter either. If the insulating layer 7 is not provided, the electrode 32 of the first light emitting unit 3 and the electrode 51 of the second light emitting unit 5 are practically replaced by one electrode. For example, the organic light emitting element 1 is formed by stacking an anode for the first light emitting unit 3, a first light emitting layer 33, a cathode serving in common for the first light emitting unit 3 and the second light emitting unit 5, a second light emitting layer 53, and an anode for the second light emitting unit 5 in this order.

Figure 3B:
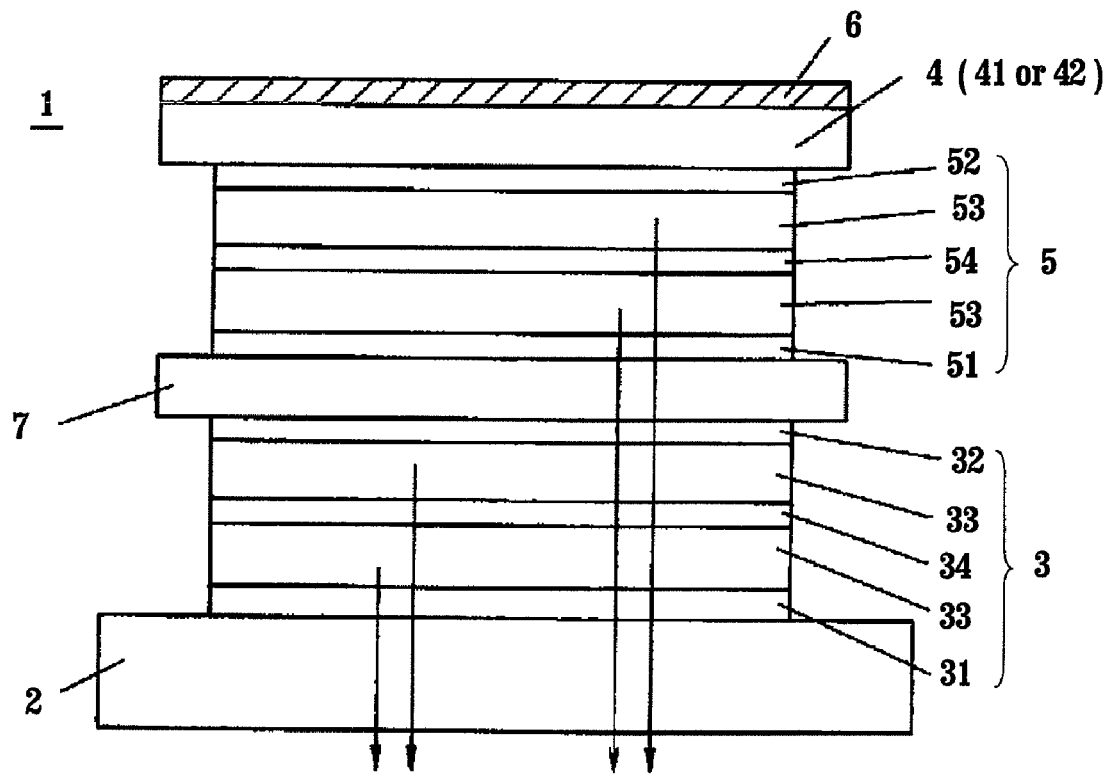

Note that the above-described first to third embodiments give examples of the organic light emitting element 1 comprising two light emitting units. However, it can be an organic light emitting element comprising three or more light emitting units as long as two adjacent light emitting units of these light emitting units meet the structures of the first light emitting unit 3 and the second light emitting unit 5 as described above. Note that similarly as in FIG. 1B and FIG. 2B, FIG. 3B shows a modified example of the present embodiment, in which the light emitting units 3, 5 comprise pluralities of light emitting layers 33, 53, respectively, while equipotential surface forming layers 34, 54 or charge generation layers 34, 54 are stacked between these light emitting layers 33, 53, respectively.

The lights emitted by the light emitting layers 33, 53 are reflected by the electrode 52 having light reflective properties in the first embodiment (refer to FIG. 1A), while reflected by the light reflective layer 6 in the second and third embodiments, and are irradiated outside the light emitting element through the light transmitting substrate 2.

In the organic light emitting elements 1 of the first to third embodiments described above, a light-transmitting insulating layer 4 is provided. This insulating layer 4 is either a layer 41 formed in a thickness to prevent lights emitted by the light emitting layers 33, 53 from interfering with other lights, or a layer 42 formed to have properties of scattering lights emitted by the light emitting layers 33, 53. Either due to the thickness of the insulation layer 4, which allows a distance between a light reflective surface and a light emitting location positioned near a light irradiation surface side to be set at a distance corresponding to an optical path length to produce essentially no light interference, or due to the light scattering properties of the insulating layer 4, the interference between the lights generated by the light emitting units 3, 5 and lights which are the lights reflected by the reflective surface is reduced, thereby reducing the angular dependence of light emission spectrum. Note that the light reflective surface described above means either the light reflective electrode 52 or the light reflective layer 6.

In the light emitting layer 53 closest to the light reflective surface in the examples illustrated in FIGS. 1A, 2A and 3A, the light interference effect is substantially reduced by setting the optical path length between its light emitting location and the reflective surface to be equal to an odd multiple of ¼ wavelength of wavelength λ of the light emitted from the light emitting location, and more preferably by setting the path length between the light emitting location and the interface, which is positioned on the opposite side to the reflective surface with respect to the light emitting location and has the largest reflectivity step (sic, correctly: refractive index step), to be equal to an integer multiple of ¼ wavelength of the wavelength1 λ of the light described above. Accordingly, the method of reducing the light interference effect based on the film thickness design described above can be used together as needed. Furthermore, the light emitting layer 33 of the light emitting unit 3 farthest from the reflective surface can be similarly designed with respect to the film thickness so as to appropriately adjust the light interference effect.

Further, in the organic light emitting element 1 according to the first and second embodiments, the pluralities of first and second light emitting units 3, 5 comprise different electrodes 31, 32 and 51, 52, respectively, while a light-transmitting insulating layer 4 is provided between the first light emitting unit 3 and the second light emitting unit 5. Thus, the respective light emitting units 3, 5 are electrically separated, and can respectively individually emit light. This similarly applies to the organic light emitting element 1 according to the third embodiment described above, if it has a light-transmitting insulating layer 7. Further, even with a structure without the insulating layer 7, use of the electrodes of the first and second light emitting units 3, 5 in common makes it possible to vary the light emission properties, if necessary, by applying different electric fields to the first light emitting unit 3 and the second light emitting element 5, respectively.

For example, assume a display formed by combining a color filter with a white light emitting element which is formed by using the organic light emitting elements 1 of one of the above-described embodiments. Even if one light emitting element in a plurality of light emitting elements forming the white light emitting element therein degrades, causing a color deviation of white light which is the primary light emission color, it is possible to correct the color deviation of the white light by appropriately adjusting the light emission colors of other non-degraded light emitting elements. Further, for illumination use, a light source can be obtained, which can freely control the color of light in a range from while light emission to red light emission, by using e.g. an organic light emitting element comprising a white light emitting unit and a red light emitting element. Further, with an organic light emitting element comprising three or more light emitting units, color control along the blackbody locus is also possible by adjusting the output of each light emitting unit. The light emission colors of the respective light emitting units and the number of light emitting units are arbitrarily set according to the use, purpose and the like of the organic light emitting element.

The respective light emitting units 3, 5 are driven for light emission by any of existing methods or a method formed by appropriately combining them. Further, the light emission output of each light emitting unit 3, 5 can be controlled by any of voltage, current and power, and can also be adjusted by supplying current with an arbitrary current/voltage waveform such as pulse. Furthermore, the respective light emitting units 3, 5 can be respectively independently controlled. For example, the output of the respective light emitting units 3, 5 can be controlled with a predetermined relationship so as to allow the light emission color to move along the blackbody locus.

Figure 4A:
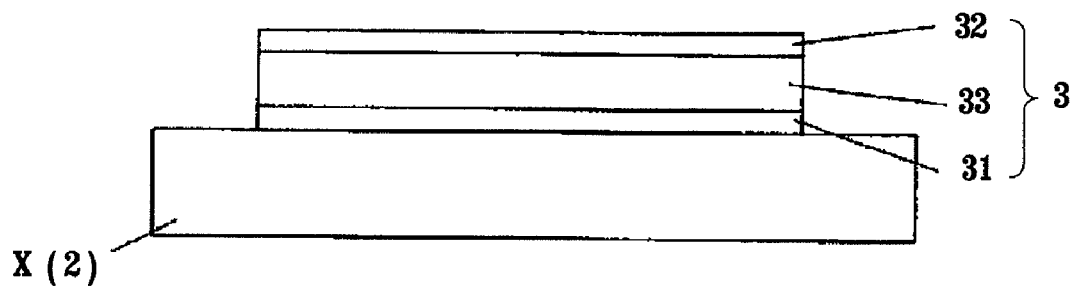
FIGS. 4A, 4B and 4C are side views showing an example of a method of manufacturing the organic light emitting elements according to the first to the third embodiments of the present invention.
Figure 4B:
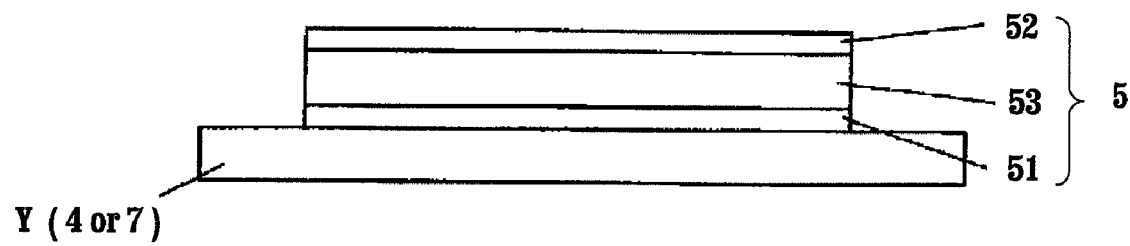
Figure 4C:
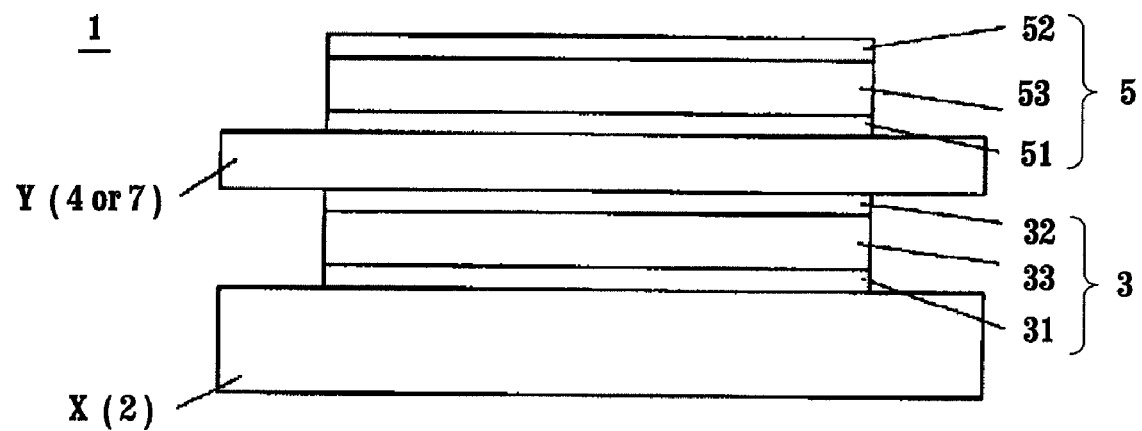

Now, an example of a method of manufacturing the organic lighting elements 1 of the first to third embodiments will be described with reference to the steps of a manufacturing process shown in FIGS. 4A to 4C. First, as shown in FIG. 4A, a first light emitting unit 3 is formed by using an arbitrary light transmitting material as a first substrate X, and by stacking an electrode 31, a light emitting layer 33 and an electrode 32 in this order on a surface of the first substrate X. Next, as shown in FIG. 4B, a second light emitting unit 5 is formed by using, as a second substrate Y, a material having light transmission properties and formed in a thickness to prevent light interference, or having light transmission properties and formed to have light scattering properties, and by stacking an electrode 51, a light emitting layer 53 and an electrode 52 in this order on a surface of this substrate Y And as shown in FIG. 4C, the second light emitting unit 5 and the substrate Y are stacked on the first electrode 32 so that a lower surface of the substrate Y without the light emitting unit 5 formed thereon contacts it. Thus, an organic light emitting element 1 having two light emitting units 3, 5 basically stacked with each other via the substrate Y is manufactured.

An organic light emitting element 1 of the first embodiment shown in FIG. 1A is manufactured such that the electrodes 31, 32, 51 are formed as light transmitting electrodes, and the electrode 52 as a light reflective electrode, while the first substrate X is formed as a substrate 2, and the second substrate Y as an insulating layer 4. Further, an organic light emitting element 1 of the second embodiment shown in FIG. 2A is manufactured such that the electrodes 31, 32, 51, 52 are formed as light transmitting electrodes, and the second substrate Y as an insulating layer 4, while a light reflective layer 6 is further formed on the electrode 52 of the second light emitting unit 5 described above. Furthermore, an organic light emitting element 1 of the third embodiment shown in FIG. 3A is manufactured such that the electrodes 31, 32, 51, 52 are formed as light transmitting electrodes, and the second substrate Y as an insulating layer 7, while a light reflective layer 6 and a light-transmitting insulating layer 4 having a thickness to prevent light interference or formed to have light scattering properties are formed on the electrode 52 of the second light emitting unit 5 described above.

Figure 5A:
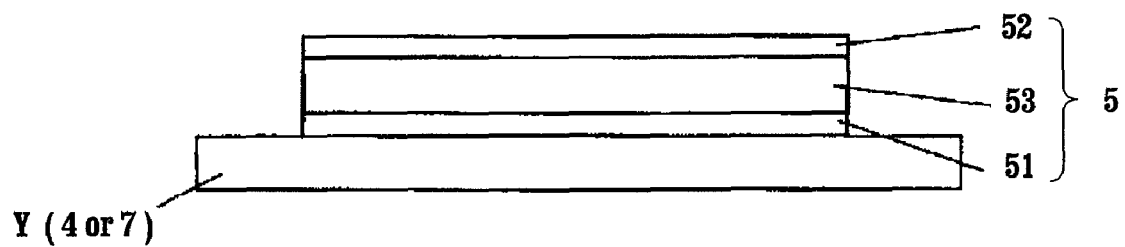
FIGS. 5A and 5B are side views showing another example of a method of manufacturing the organic light emitting elements according to the first to the third embodiments of the present invention.

Next, another example of a method of manufacturing the organic lighting elements 1 of the first to third embodiments will be described with reference to the steps of a manufacturing process shown in FIGS. 5A and 5B. First, as shown in FIG. 5A, a second light emitting unit 5 is formed by using, as a substrate Y, a light transmitting material having a thickness to prevent light interference or formed to have light scattering properties, and by stacking an electrode 51, a light emitting layer 53 and an electrode 52 in this order on a surface of this substrate Y. Next, as shown in FIG. 5B, a first light emitting unit 3 is formed by stacking an electrode 32, a light emitting layer 33 and an electrode 31 in this order on a surface of the substrate Y without the light emitting unit 5 formed thereon, whereby an organic light emitting element 1 having two light emitting units 3, 5 stacked with each other via the substrate Y is manufactured.

With this manufacturing method, the organic light emitting elements of the first to third embodiments described above are manufactured such that a part of the electrodes is (are) formed as an electrode (electrodes) having light reflective properties, or such that a light reflective layer 6 is further stacked, or a substrate X or the like is appropriately placed.

In the case where a light emitting unit is formed on an arbitrary substrate, and thereafter a light-transmitting insulating layer having a thickness to prevent light interference or having light scattering properties is formed, it is necessary to use an insulating layer which fits the film thickness and material of the light emitting unit. This is a factor causing the manufacturing process to be complicated. On the other hand, as in the manufacturing method described above, if a first light emitting unit 3 and a second light emitting unit 5 are formed in advance on a light transmitting material Y as a substrate having a thickness to prevent light interference or having light scattering properties, it is possible to easily adjust the selection of the film thickness and material of the light emitting units, so that there is no risk of complicating the manufacturing process.

Figure 5B:
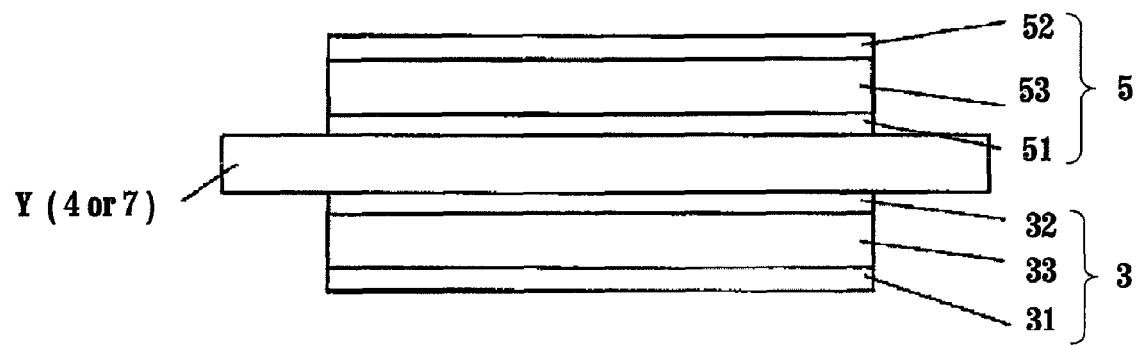
Figure 6A:
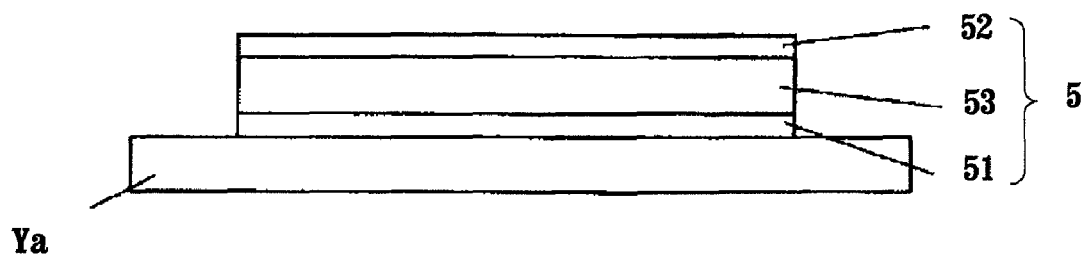
FIGS. 6A, 6B and 6C are side views showing a modified example of the method of manufacturing the organic light emitting elements according to the first to the third embodiments of the present invention.
Figure 6B:
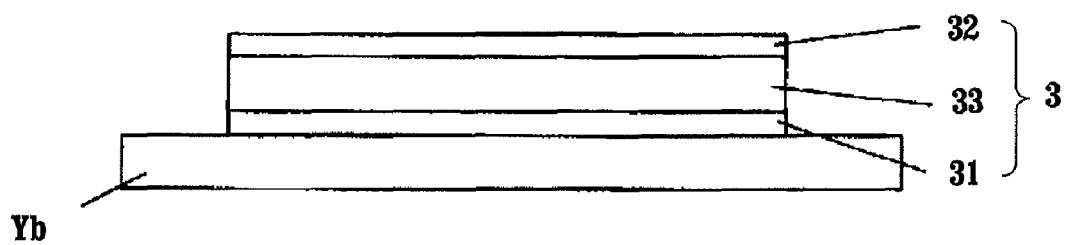
Figure 6C:
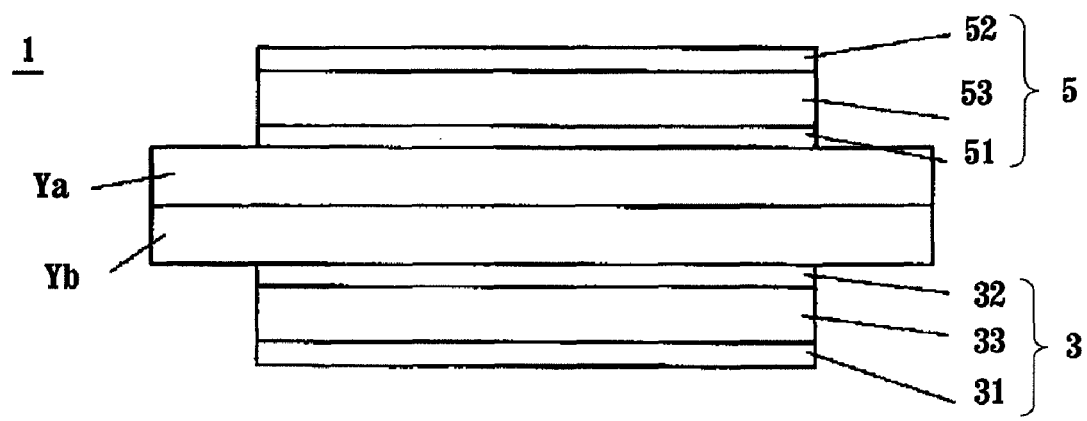

Further, as a modified example of the manufacturing method shown in FIGS. 5A and 5B, it is possible, for example, that as shown in FIG. 6A, a second light emitting unit 5 is formed on a light transmitting substrate Ya, while as shown in FIG. 6B, a first light emitting unit 3 is formed on a separate light transmitting substrate Yb, and thereafter as shown in FIG. 6C, the surfaces of the respective substrates Ya, Yb without the light emitting units 5, 3 formed thereon are contacted with each other. Further, in this modified example, the surfaces of the two substrates Ya, Yb without the light emitting units 5, 3 formed thereon can also be placed close to each other at a predetermined distance. In this case, it is desirable that a medium having scattering properties or a medium having a refractive index equivalent to the substrates Ya, Yb is filled in between the substrates Ya, Yb so as to bond both substrates. This modified example makes it possible to form the light emitting units 3, 5 at the same time rather than sequentially forming the light emitting units 3, 5 on both surfaces of one substrate Y, thereby increasing the manufacturing efficiency.

Hereinafter, the organic light emitting element of the present invention will be described with reference to organic light emitting elements of more specific examples. The organic light emitting elements of the examples are manufactured by combining a blue light emitting element A, a yellow light emitting element B, white light emitting elements C, E, F, a red light emitting element D and so on which will be described below. Now, first, respective light emitting elements of the respective colors forming the organic light emitting elements of the examples, and then manufacturing processes of the respective organic light emitting elements of the examples and comparative examples, will be described specifically.

<Blue Light Emitting Element A>

First, an ITO-attached glass base plate 20 having 1100 Å thick ITO (sheet resistance of 12 Ω/sq) formed on one surface of a 0.7 mm thick glass base plate was prepared. The ITO-attached glass base plate 20 was etched to remove ITO, leaving ITO in an area 21 shown in FIG. 7A. Next, the ITO-attached glass base plate 20 was cleaned with ultrasonic waves for 10 minutes each in pure water, acetone and isopropyl alcohol, and was then steam-cleaned and dried in isopropyl alcohol steam for 2 minutes, and was thereafter further cleaned by UV ozone for 10 minutes.

Next, the ITO-attached glass base plate 20 was placed in a vacuum vapor deposition apparatus. By using a mask 81 having an opening portion 80 with the size shown in FIG. 7B, and under reduced pressure of 5×10$^{-5}$ Pa, 4,4'-bis[N-(naphthyl)-N-phenyl-amino]biphenyl ("α-NPD" manufactured by E-Ray Company) and molybdenum oxide (MoO$_3$) were vapor-deposited at a deposition rate ratio of 3:1 and a total deposition rate of 1.3 Å/s into a thickness of 100 Å, thereby forming a hole injection layer on the ITO serving as an anode. Next, "α-NPD" was vapor-deposited on the hole injection layer at a vapor deposition rate of 1 Å/s into a thickness of 700 Å, thereby forming a hole transport layer. Further, a layer of a dinaphthylanthracene derivative ("BH-2" manufactured by Kodak Company) with 4 percent by mass of distyrylarylene derivative ([Chemical Formula 1]) doped therein was stacked with a thickness of 500 Å on the hole transport layer, thereby providing a light emitting layer for blue light emission. Next, on this light emitting layer, bathocuprine ("BCP" manufactured by Dojin Kagaku Kenkyusho Co., Ltd.) in a thickness of 100 Å as well as "BCP" and cesium (Cs) in a mole ratio of 1:1 and a thickness of 100 Å were co-vapor-deposited, thereby providing an electron injection layer. Furthermore, thereon, "α-NPD" and molybdenum oxide (MoO$_3$) were vapor-deposited at a deposition rate ratio of 3:1 and a total deposition rate of 1.3 Å/s into a thickness of 100 Å, thereby forming a charge generation layer. Subsequently, thereon, a hole transport layer in a thickness of 700 Å, a light emitting layer in a thickness of 500 Å, an electron transport layer in a thickness of 100 Å, and an electron injection layer in a thickness of 100 Å were stacked similarly as described above. Furthermore, thereon, aluminum (Al) in a thickness of 100 Å was stacked at a deposition rate of 4 Å/s by using a mask 83 having an opening portion 82 with the size shown in FIG. 7C so as to form a light transmitting cathode, thereby obtaining a blue light emitting element A comprising double-layered blue light emitting layers via a charge generation layer.

[Chemical Formula 1]

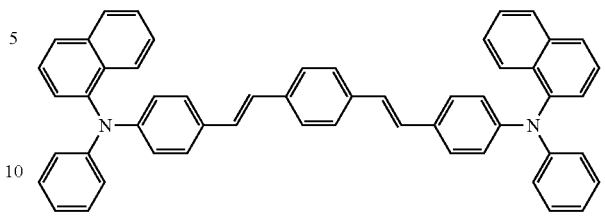

<Yellow Light Emitting Element B>

Figure 7A:
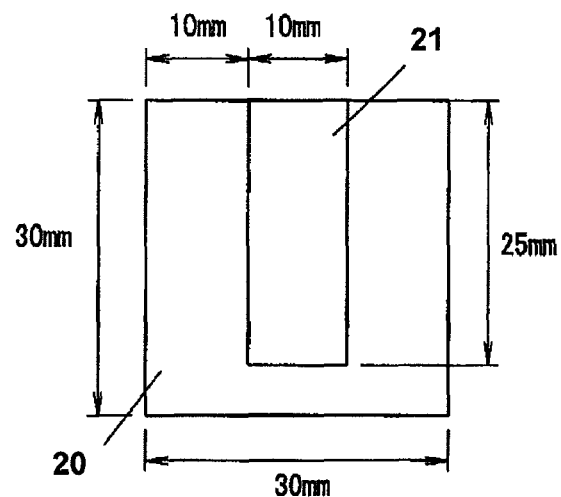

First, an ITO area 21 having a thickness of 1100 Å was formed as a film with the size shown in FIG. 7A on one surface of a 150 μm thick glass plate. This ITO-attached glass plate 20 was placed in a vacuum vapor deposition apparatus. A process similar to that described above was performed by using the mask 81 shown in FIG. 7B to form a 150 Å thick co-vapor-deposition layer having "BCP" and Cs in a mole ratio of 1:1 as an electron injection layer, a 50 Å thick "BCP" as an electron transport layer, a 500 Å thick layer of "BH-2" with 4 percent by mass of a material represented by [Chemical Formula 2] doped therein as a light emitting layer, a 400 Å thick "α-NPD" as a hole transport layer, and a 200 Å thick layer having "α-NPD" and MoO$_3$ co-vapor-deposited at a rate of 3:1 as a hole injection layer in this order on the ITO serving as a cathode. Finally, Al in a thickness of 800 Å was stacked at a deposition rate of 4 Å/s by using the mask 83 shown in FIG. 7C so as to form a light reflective anode, thereby obtaining a yellow light emitting element B comprising a single light emitting layer for yellow light emission.

[Chemical Formula 2]

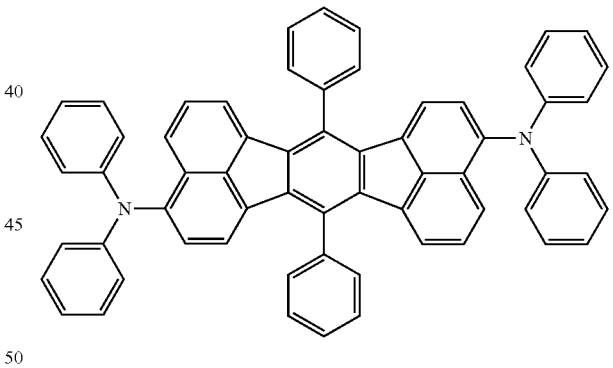

<White Light Emitting Element C>

A white light emitting element C for white light emission was manufactured in a similar process to that for manufacturing the blue light emitting element A described above, except that the second formed light emitting layer in the manufacturing of the blue light emitting element A described above is formed by stacking a 50 Å thick layer of "BH-2" with 1 percent by mass of the compound of [Chemical Formula 2] doped therein and a 450 Å thick layer of "BH-2" with 4 percent by mass of the compound of [Chemical Formula 1] doped therein. The emission chromaticity of the white light emitting element C was (0.28, 0.37).

<Red Light Emitting Element D>

A red light emitting element D for red light emission was obtained in a similar process to that for manufacturing the yellow light emitting element B described above, except that as the light emitting layer in the manufacturing of the yellow light emitting element B described above, a 500 Å thick layer of tris(8-hydroxyquinolinate) aluminum complex (Alq) with 2 percent by mass of a red dopant (DCJTB) doped therein is formed by vapor deposition.

<White Light Emitting Element E>

Figure 7B:
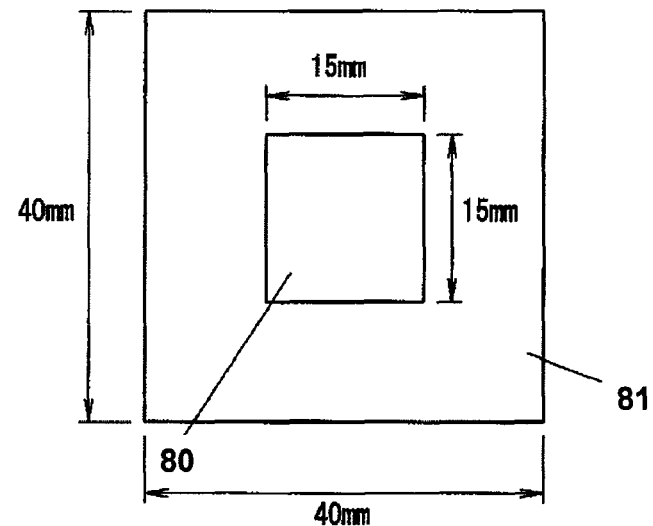
FIGS. 7B and 7C are plan views of masks to be used for manufacturing the organic light emitting elements.
Figure 7C:
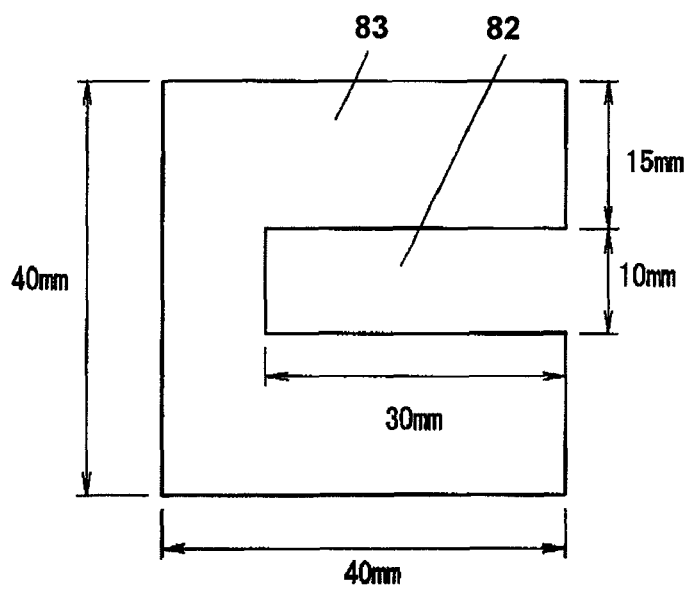

A blue light emitting unit was provided by using the mask 81 having the opening portion 80 with the size shown in FIG. 7B, and by vapor-depositing a 50 Å thick co-vapor-deposition layer having "BCP" and Cs in a mole ratio of 1:1 as an electron injection layer, a 150 Å thick Alq as an electron transport layer, a 500 Å thick layer of "BH-2" with 4 percent by mass of a material represented by [Chemical Formula 1] doped therein as a light emitting layer, a 600 Å thick "α-NPD" as a hole transport layer, and a 150 Å thick layer having "α-NPD" and $MoO_3$ co-vapor-deposited at a rate of 3:1 as a hole injection layer on the same ITO-attached glass base plate 20 as used for manufacturing the blue light emitting element A described above. Next, a yellow light emitting unit was provided by vapor-depositing a 50 Å thick co-vapor-deposition layer having "BCP" and Cs in a mole ratio of 1:1 as an electron injection layer, a 250 Å thick Alq as an electron transport layer, a 500 Å thick layer of "BH-2" with 1.5 percent by mass of a material represented by [Chemical Formula 2] doped therein as a light emitting layer, a 600 Å thick "α-NPD" as a hole transport layer, and a 150 Å thick layer having "α-NPD" and $MoO_3$ co-vapor-deposited at a rate of 3:1 as a hole injection layer. Further, a blue light emitting unit was provided by vapor-depositing a 50 Å thick co-vapor-deposition layer having "BCP" and Cs in a mole ratio of 1:1 as an electron injection layer, a 150 Å thick Alq as an electron transport layer, a 500 Å thick layer of "BH-2" with 4 percent by mass of a material represented by [Chemical Formula 1] doped therein as a light emitting layer, a 600 Å thick "α-NPD" as a hole transport layer, and a 200 Å thick layer having "α-NPD" and $MoO_3$ co-vapor-deposited at a rate of 3:1 as a hole injection layer. Finally, gold in a thickness of 100 Å was vapor-deposited by using the mask 83 having the opening portion 82 with the size shown in FIG. 7C so as to form an anode, and further lithium fluoride (LiF) in a thickness of 600 Å was vapor-deposited as a protective layer and as a layer having an intermediate refractive index between the electrode and air, thereby obtaining a white light emitting element E comprising an anode made of gold.

<White Light Emitting Element F>

A white light emitting element F comprising an anode made of Al was obtained in a similar process to the white light emitting element E by forming the three kinds of light emitting layers, and by vapor-depositing Al in a thickness of 800 Å instead of the last gold electrode.

<Organic Light Emitting Element of Example 1>

Figure 8A:
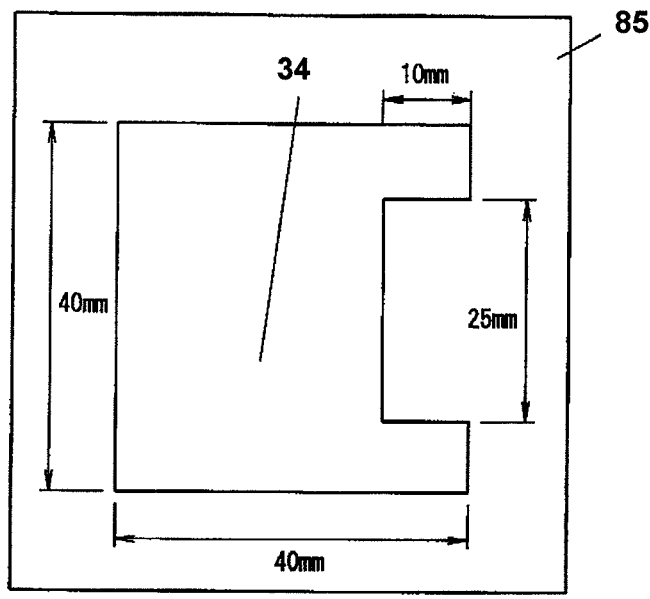
FIGS. 8A, 8B and 8C are plan views of masks to be used for manufacturing the organic light emitting elements.
Figure 8B:
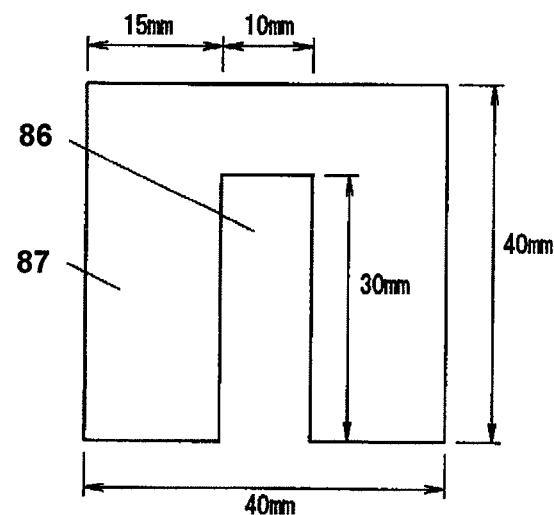
Figure 8C:
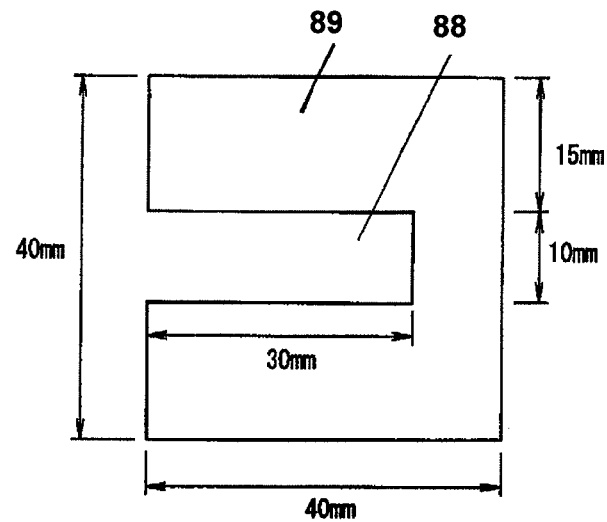

A blue light emitting element A described above was placed in a vacuum vapor deposition apparatus. By using a mask 85 having an opening portion 84 with the size shown in FIG. 8A, LiF in a thickness of 20 μm was vacuum-deposited on the blue light emitting element A, thereby forming a light-transmitting insulating layer having a thickness to prevent light interference. Next, on this insulating layer, gold in a thickness of 100 Å was formed as a film by using a mask 87 having an opening portion 86 with the size shown in FIG. 8B, thereby forming a transparent anode. Further formed thereon by using the mask 81 having the opening portion 80 with the size shown in FIG. 7B were a 1200 Å thick layer having "α-NPD" and $MoO_3$ co-vapor-deposited at a rate of 3:1 as a hole injection layer, a 500 Å thick "α-NPD" as a hole transport layer, a 500 Å thick layer of "BH-2" with 4 percent by mass of a material represented by [Chemical Formula 2] doped therein as a light emitting layer for yellow light emission, a 50 Å thick "BCP" as an electron transport layer, and a 150 Å thick co-vapor-deposition layer having "BCP" and Cs in a mole ratio of 1:1 as an electron injection layer, respectively, in this order. Finally, Al in a thickness of 800 Å was stacked by using a mask 89 having an opening portion 88 with the size shown in FIG. 8C so as to form a light reflective cathode, thereby obtaining an organic light emitting element of Example 1. Note that the yellow light emitting unit formed on the cathode of the blue light emitting element A does not have its own substrate, so that it cannot be called a stand-alone light emitting element, but will be referred to as yellow light emitting element G in the following description for the sake of convenience. In other words, the organic light emitting element of Example 1 is such that a light-transmitting insulating layer (LiF in a thickness of 20 μm) having a thickness to prevent light interference is formed on the cathode of the blue light emitting element A, and the yellow light emitting element G is stacked thereon.

Figure 9:
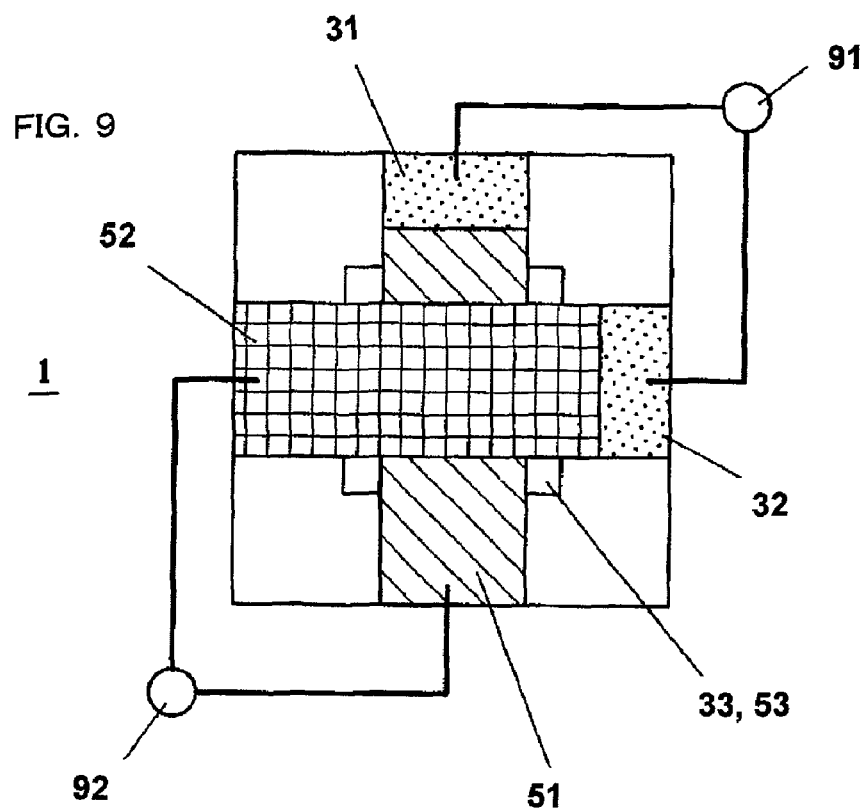
FIG. 9 is a plan view of the organic light emitting element.

Note that as shown in FIG. 9, in the organic light emitting element of Example 1, the anode 31 and the cathode 32 of the blue light emitting element A at the lower position are connected to a power supply 91, while the anode 51 and the cathode 52 of the yellow light emitting element G at the upper position are connected to a power supply 92, so as to make it possible to supply current to the light emitting units of the respective light emitting elements A and G.

<Organic Light Emitting Element of Example 2>

Figure 10:
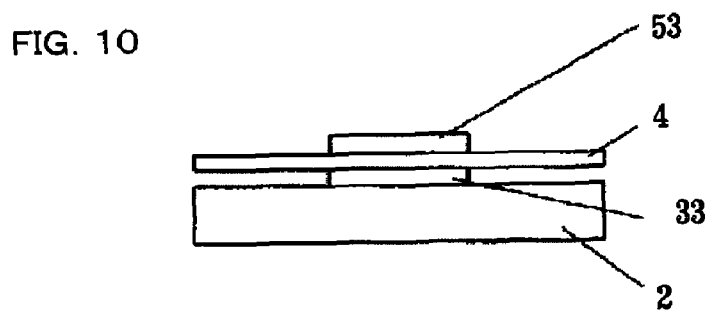
FIG. 10 is a side view of the organic light emitting element.

As shown in FIG. 10, on a light emitting unit 3 of a blue light emitting element A, a yellow light emitting element B was stacked with its glass plate 4 facing downward, thereby obtaining an organic light emitting element of Example 2. The glass plate of the yellow light emitting element B placed at the upper position is formed as an insulating layer having a thickness (150 μm) to prevent light interference. Thus, the organic light emitting element of Example 2 has a structure such that the blue light emitting element A and the yellow light emitting element B are essentially stacked via the insulating layer 4 having a thickness to prevent interference.

<Organic Light Emitting Element of Example 3>

Figure 11:
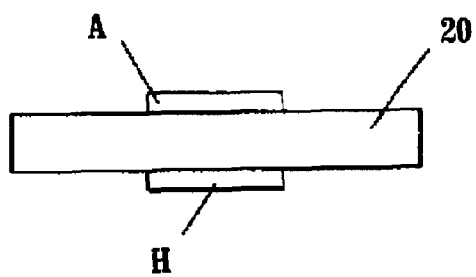
FIG. 11 is a side view of the organic light emitting element.

An organic light emitting element of Example 3 was obtained by subjecting the surface of an ITO-attached glass plate 20 without a light emitting unit formed thereon to the process of manufacturing the organic light emitting element of Example 1 from the vapor deposition of the gold electrode onward (manufacturing process of the yellow light emitting element G). Note that the yellow light emitting unit provided on the substrate of the blue light emitting element A will be referred to as yellow light emitting element H for the sake of convenience. In other words, the organic light emitting element of Example 3 is such that as shown in FIG. 11, the blue light emitting element A and the yellow light emitting element H are stacked via the light-transmitting insulating layer (glass plate) having a thickness (0.7 mm) to prevent light interference.

<Organic Light Emitting Element of Example 4>

An organic light emitting element of Example 4 was obtained by stacking a white light emitting element C and a red light transmitting element D similarly as in the organic light emitting element of Example 2. In other words, the substrate of the red light emitting element D placed at the upper position is formed as a light-transmitting insulating layer (glass plate) having a thickness (150 μm) to prevent light interference. Thus, the organic light emitting element of Example 4 has a structure such that the white light emitting element C and the red light emitting element D are essentially stacked via the insulating layer having a thickness to prevent interference.

<Organic Light Emitting Element of Example 5>

In the manufacturing of the organic light emitting element of Example 1, instead of the insulating layer made of LiF, a CVD process was used to form a silicon oxynitride (SiON) film in a thickness of 1000 Å. Coated thereon was a 12 μm thick mixed resin which was prepared by adding to a photocurable resin "30Y-431", manufactured by Three Bond Company, 50 percent by mass of titanium oxide particles prepared by mixing those having a particle size of 2 μm with those having a particle size of 4 μm in a weight ratio of 1:1, and which was cured by ultraviolet radiation, so as to provide a light scattering layer, thereby forming an insulating layer having light scattering properties. In other words, the organic light emitting element of Example 5 was obtained by stacking the blue light emitting element A and the yellow light emitting element G via the insulating layer having light scattering properties.

<Organic Light Emitting Element of Example 6>

A blue light emitting element A described above was placed in a vacuum vapor deposition apparatus. By using the mask 81 shown in FIG. 7B, a 150 Å thick co-vapor-deposition layer having "BCP" and Cs in a mole ratio of 1:1 as an electron injection layer, a 50 Å thick "BCP" as an electron transport layer, a 500 Å thick layer of "BH-2" with 4 percent by mass of a material represented by [Chemical Formula 2] doped therein as a light emitting layer, a 400 Å thick "α-NPD" as a hole transport layer, and a 200 Å thick layer having "α-NPD" and $MoO_3$ co-vapor-deposited at a rate of 3:1 as a hole injection layer were formed on the cathode of the blue light emitting element A. Next, by using the mask 83 shown in FIG. 7C, a 800 Å thick IZO layer was formed as a light transmitting anode, thereby forming a yellow light emitting element I. Further, a 500 Å thick SiON film was sputtered on this yellow light emitting element I so as to form a light-transmitting insulating layer having a thickness to prevent light interference. Furthermore, thereon, a 20 μm thick photocurable resin "30Y-431" manufactured by Three Bond Company was coated and cured, and a 1000 Å thick Al was provided as a light reflective layer, thereby obtaining an organic light emitting element of Example 6. Note that the yellow light emitting unit provided on the cathode of the blue light emitting element A will be referred to as yellow light emitting element I for the sake of convenience. In the organic light emitting element of Example 6, the blue light emitting element A and the yellow light emitting element I respectively have their own anodes, whereas a common electrode is used for the respective cathodes.

<Organic Light Emitting Element of Example 7>

An organic light emitting element of Example 7 was obtained by stacking a white light emitting element E and a red light transmitting element D, in an aligned positional relationship of their light emitting surfaces, with an adhesive having a refractive index of 1.5 on their surfaces without the respective light emitting units formed thereon.

Figure 12:
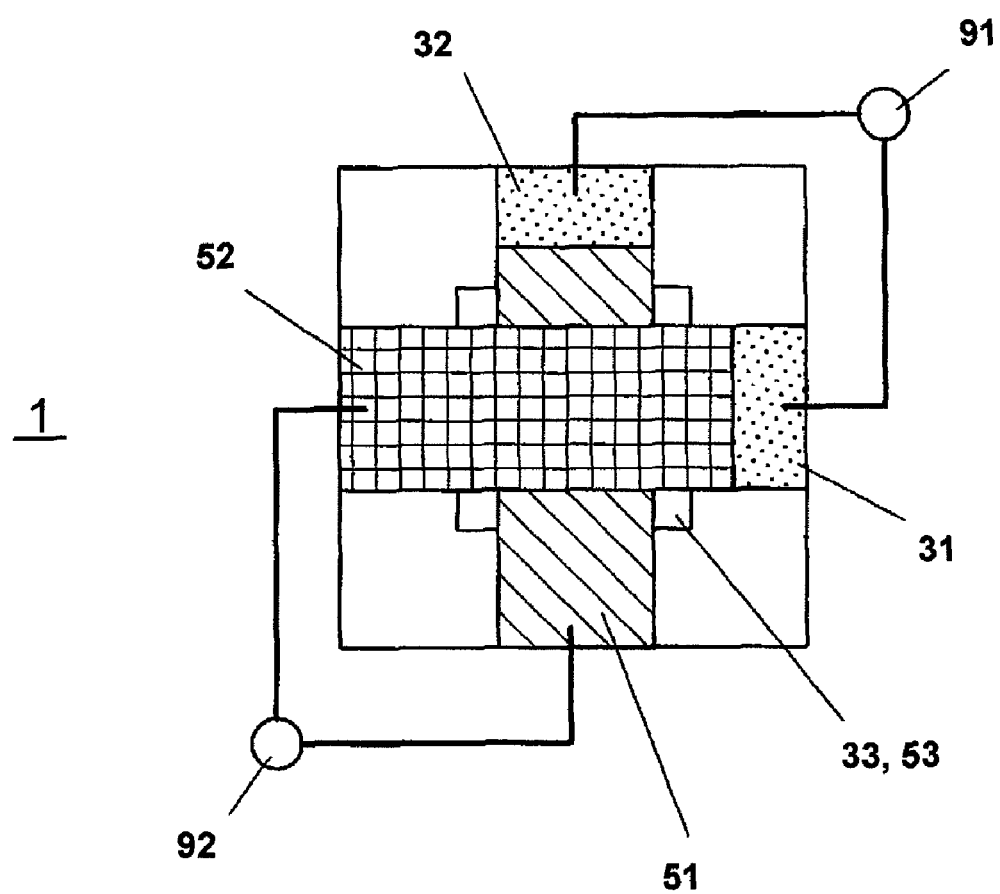
FIG. 12 is a plan view of the organic light emitting element.

As shown in FIG. 12, in the organic light emitting element of Example 7, the cathode 32 and the anode 31 of the red light emitting element D are connected to a power supply 91, while the cathode 51 and the anode 52 of the white light emitting element E are connected to a power supply 92, so as to make it possible to supply current to the light emitting units of the respective elements D and E. Note that here the emitted light is irradiated through the gold electrode as the anode 52 of the white light emitting element E.

<Organic Light Emitting Element of Comparative Example 1>

An organic light emitting element of Comparative Example 1 was obtained in a manufacturing process similar to that for the organic light emitting element of Example 1, except that the film thickness of LiF was set at 1000 Å.

<Organic Light Emitting Element of Comparative Example 2>

An organic light emitting element of Comparative Example 2 was obtained in a manufacturing process similar to that for the organic light emitting element of Example 1, except that LiF was not formed. In the organic light emitting element of Comparative Example 2, an insulating layer is not placed between the blue light emitting element A and the yellow light emitting element Q so that the cathode of the blue light emitting element A is electrically connected to the anode of the yellow light emitting element G. Thus, the blue light emitting element A and the yellow light emitting element G are essentially connected in series, so that it is sufficient to connect a power supply only to the anode of the blue light emitting element A and the cathode of the yellow light emitting element G.

<Organic Light Emitting Element of Comparative Example 3>

The white light emitting element F was served as an organic light emitting element of Comparative Example 3.

The above described organic light emitting elements, as described above, were each connected to a power supply (Keithley Model 2400), and driven by a constant current, and the CIE chromaticity of each organic light emitting element was measured by a multichannel analyzer ("PMA-11" manufactured by Hamamatsu Photonics Company: measurement distance of 25 cm). The organic light emitting elements of Example 1 to Example 6 and Comparative Examples 1 and 2 were subjected to spectral evaluations from the front direction, and from a direction at 45 degrees to the front, of each organic light emitting element, while the organic light emitting elements of Example 7 and Comparative Example 3 from the front direction, and from directions at 20 degrees, 40 degrees and 60 degrees to the front, of each organic light emitting element.

Figure 13A:
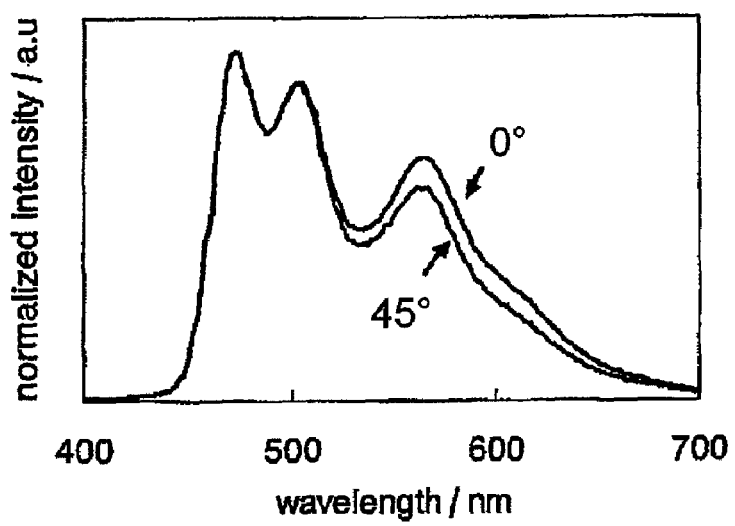
FIG. 13A is a graph showing emission spectra of an organic light emitting element of Example 1.
Figure 13B:
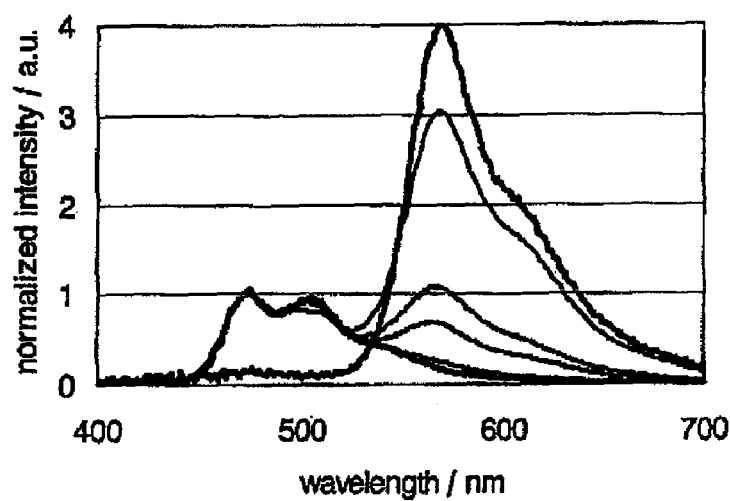

FIG. 13A shows respective emission spectra of the organic light emitting element of Example 1 as observed from the front direction (0°) and observed from the angle of 45° (45°) when supplied with current to set the X value of chromaticity coordinates as observed from the front direction at 0.30. This indicates that a difference between a spectrum observed from the front direction and that observed from the angle of 45 degrees is relatively small. Besides, in the organic light emitting element of Example 1, the chromaticity coordinates from the front direction were (0.30, 0.39), while the chromaticity coordinates from 45 degrees were (0.31, 0.40). Note that FIG. 13B shows variations in emission spectra as observed from the front direction when the emission intensity ratio, with respect to each other, of the respective blue light emitting element A and yellow light emitting element Q which form the organic light emitting element of Example 1, was variously changed.

Figure 13C:
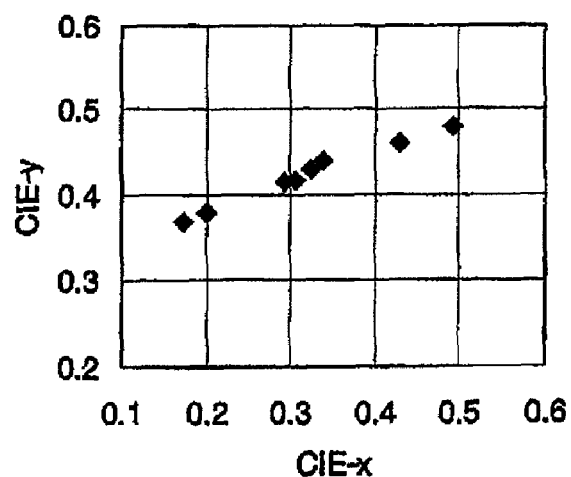
FIG. 13C is a graph showing the relationship between the light intensity ratio and color of the same.

Further, as shown in FIG. 13C, the organic light emitting element of Example 1 can emit light having an arbitrary color on a line connecting the light emission color of the blue light emitting element A and the light emission color of the yellow light emitting element G by changing the emission intensity ratio, with respect to each other, of the respective blue light emitting element A and the yellow light emitting element G Note that the organic light emitting element of Example 4 could be designed to have an arbitrary light emission color on a line connecting white color and red color (not shown).

Figure 14A:
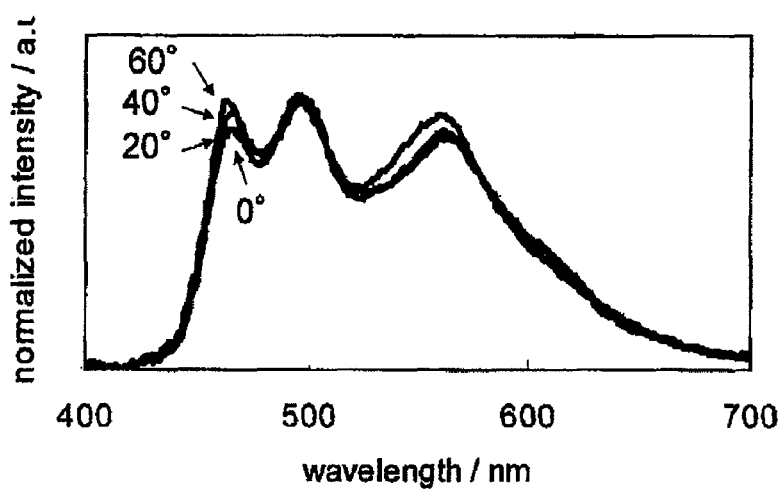
FIG. 14A is a graph showing emission spectra of an organic light emitting element of Example 7.
Figure 14B:
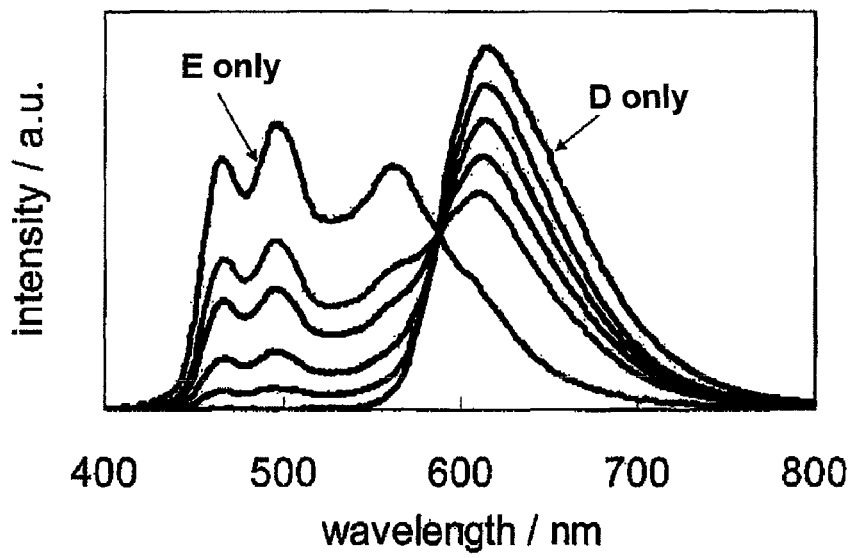
Figure 14C:
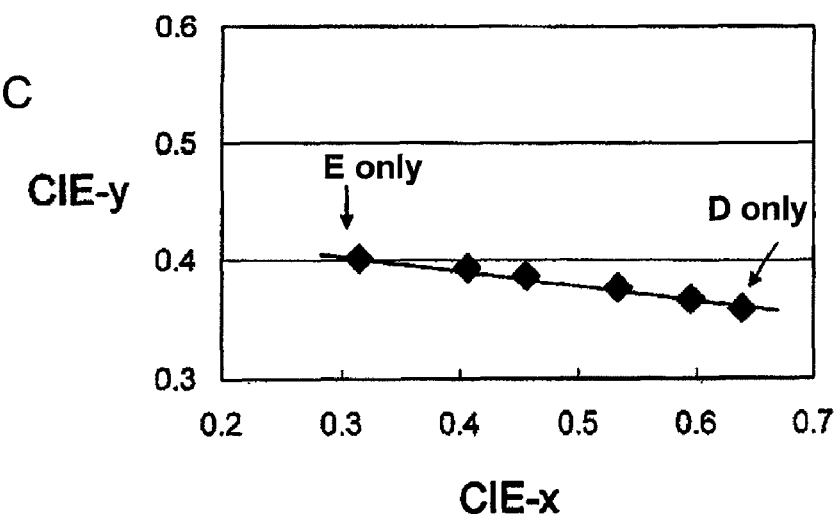
FIG. 14C is a graph showing variations in the light emission color of the same on the CIE chromaticity coordinates.

FIG. 14A shows emission spectra of the organic light emitting element of Example 7 as observed from the front direction (0°) and directions of 20°, 40° and 60° when only the white light emitting element E was allowed to emit light. The emission spectra observed from all the directions are similar, which indicates that the angular dependence of the organic light emitting element of Example 7 is small. FIG. 14B shows variations in emission spectra when the white light emitting element E and the red light emitting element D forming the organic light emitting element of Example 7 were driven at arbitrary current ratios. This indicates that the light spectra emitted from both light emitting elements are arbitrarily mixed to achieve a wide emission spectrum. FIG. 14C shows variations here in the light emission color on the CIE chromaticity coordinates. That is, the organic light emitting element of Example 7 can emit light of an arbitrary chromaticity near a line connecting the respective chromaticity coordinates of the white light emitting element E and the red light emitting element D. Note that in the drawing, the description of "E only" is a light emission spectrum or chromaticity coordinates when only the white light emitting element E was allowed to emit light. This applies similarly to "D only".

Figure 15:
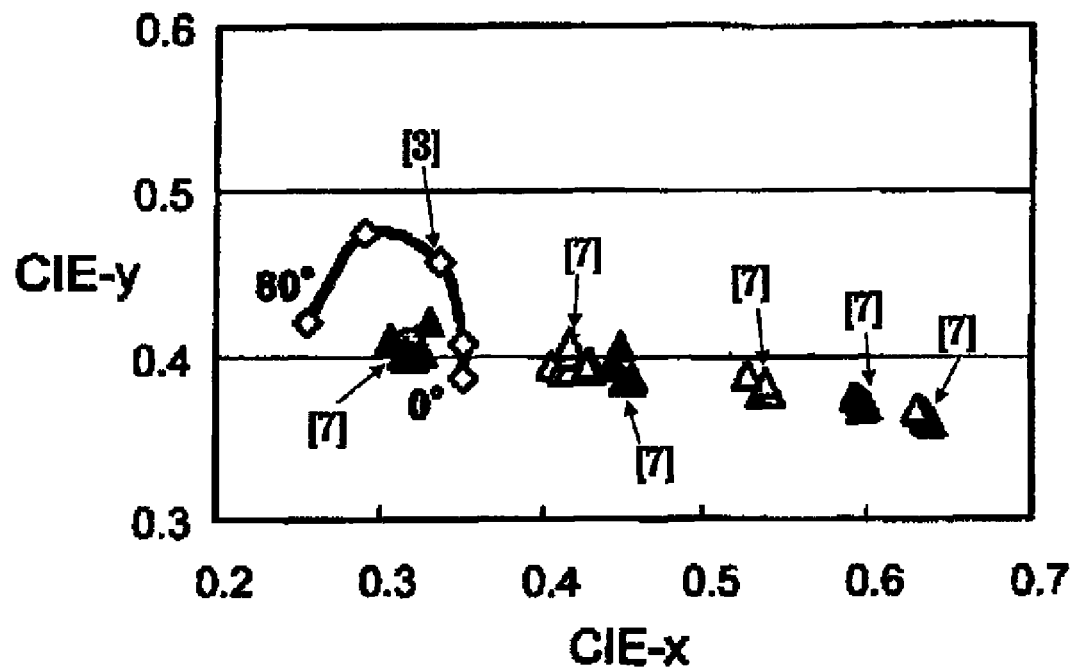
FIG. 15 is a graph showing variations in the light emission color on the CIE chromaticity coordinates at respective angles when the organic light emitting elements of Example 7 and Comparative Example 3 were rotated in a range from 0° to 80°.
Figure 16:
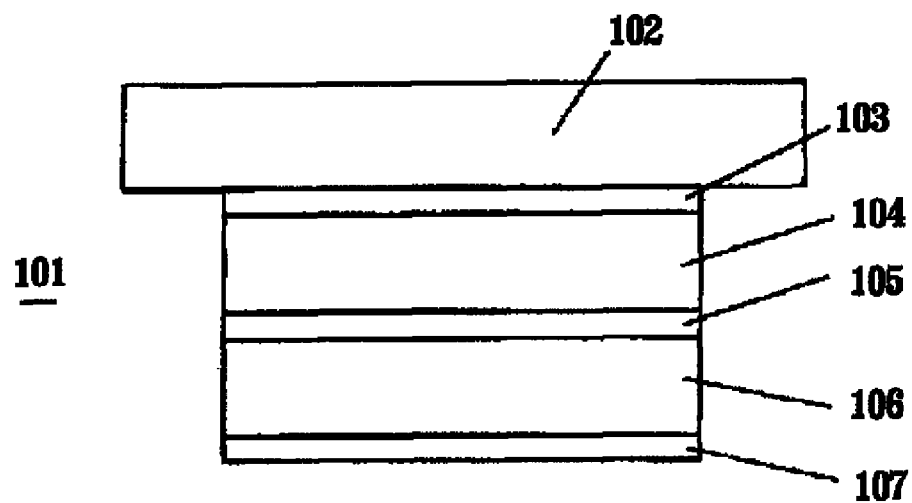
FIG. 16 is a side view showing a conventional organic light emitting element.

FIG. 15 shows variations in the light emission color on the CIE chromaticity coordinates at respective angles when the organic light emitting elements of Example 7 and Comparative Example 3 were rotated in a range from 0° to 80°. In this figure, "▲" and "△" represent CIE chromaticity coordinate points shown by the light emitting element of Example 7 in a range of the observation angle from 0° to 80° when driven for six different light emission colors. Further, "◇" represents CIE chromaticity coordinate points shown by the white light emitting element of Comparative Example 3 in a range from 0° to 80°. That is, in the white light emitting element of Comparative Example 3, the CIE chromaticity coordinates points significantly vary depending on the observation angle, so that the angular dependence of the light emission color is large. On the other hand, the CIE chromaticity coordinates points shown by the organic light emitting element of Example 7 in a range of the observation angle from 0° to 80°, when driven for six different light emission colors, are similar coordinates in the respective light emission colors, so that the angular dependence of the light emission color is small.

Table 1 shows the measurement results of the organic light emitting elements of the respective Examples and respective Comparative Examples manufactured as described above with respect to the chromaticity from the front direction and the chromaticity from the 45° direction. Note that Table 1 does not describe Example 7 and Comparative Example 3, since they have already been described above.

[Table 1]

TABLE 1

|  | Chromaticity from Front Direction | Chromaticity from 45° Direction | Angular Dependence of Chromaticity | Color Adjustment |
| --- | --- | --- | --- | --- |
| Ex. 1 | (0.30, 0.39) | (0.31, 0.40) | Small | Possible |
| Ex. 2 | (0.30, 0.41) | (0.28, 0.41) | Small | Possible |
| Ex. 3 | (0.30, 0.36) | (0.27, 0.35) | Small | Possible |
| Ex. 4 | (0.30, 0.33) | (0.31, 0.35) | Small | Possible |
| Ex. 5 | (0.30, 0.41) | (0.27, 0.37) | Small | Possible |
| Ex. 6 | (0.30, 0.39) | (0.30, 0.36) | Small | Possible |
| Comp. Ex. 1 | (0.30, 0.38) | (0.21, 0.35) | Large | Possible |
| Comp. Ex. 2 | (0.30, 0.39) | (0.22, 0.36) | Large | Impossible |

As shown by the results of "Angular Dependence of Chromaticity" in Table 1, the angular dependence of light emission chromaticity of all the organic light emitting elements of Examples 1 to 6 is small. On the other hand, the angular dependence of light emission chromaticity of all the organic light emitting elements of Comparative Examples 1 and 2 is large. Furthermore, as shown by the results of "Color Adjustment" in Table 1, the color adjustment is possible in the organic light emitting elements of Examples 1 to 6 because the respective stacked elements can be individually driven, whereas the color adjustment is impossible in the organic light emitting element of Comparative Example 2 because the two elements are electrically connected to each other, making it impossible to individually drive the two elements.

It is to be noted that this application is based on Japanese patent application 2005-276861, the content of which is incorporated into this application by reference.

The invention claimed is:

1. An organic light emitting element comprising a first light emitting unit having a light emitting layer between a pair of electrodes, and a second light emitting unit having a light emitting layer between a pair of electrodes, wherein:
   one electrode of the four electrodes of the first and second light emitting units, which is positioned on the outermost side, has light reflective properties while the other electrodes have light transmission properties;
   a light-transmitting insulating layer is provided between the first and second light emitting units; and
   the insulating layer is formed in a thickness to prevent light emitted by the light emitting layer of the light emitting unit without the light reflective electrode from interfering with other lights, or formed to have properties of scattering the light emitted by the same light emitting layer.

2. An organic light emitting element comprising a first light emitting unit having a light emitting layer between a pair of electrodes, and a second light emitting unit having a light emitting layer between a pair of electrodes, wherein:
   the four electrodes of the first and second light emitting units have light transmission properties, while a light reflective layer having light reflective properties is provided on an outer side of one of the electrodes which is positioned on the outermost side;
   a light-transmitting insulating layer is provided between the first and second light emitting units; and
   the insulating layer is formed in a thickness to prevent light emitted by the light emitting layer of the light emitting unit without the light reflective layer from interfering with other lights, or formed to have properties of scattering the light emitted by the same light emitting layer.

3. An organic light emitting element comprising a first light emitting unit having a light emitting layer between a pair of electrodes, and a second light emitting unit having a light emitting layer between a pair of electrodes, wherein:
   the four electrodes of the first and second light emitting units have light transmission properties;
   a light-transmitting insulating layer is provided on an outer side of one of the electrodes which is positioned on the outermost side, with a reflective layer having light reflective properties on an outer side of the insulating layer; and
   the insulating layer is formed in a thickness to prevent light emitted by the light emitting layer of the light emitting unit without the light reflective layer from interfering with other lights, or formed to have properties of scattering the light emitted by the same light emitting layer.

4. The organic light emitting element according to claim 1, wherein at least one of the first and second light emitting units has a plurality of light emitting layers,
the plurality of light emitting layers being stacked via an equipotential surface forming layer or a charge generation layer.

5. The organic light emitting element according to claim 1, wherein the insulating layer is formed of a glass plate or a film.

6. A method of manufacturing the organic light emitting element according to claim 1, which includes:
a step of forming one of the first and second light emitting units in a manner that one material of a light transmitting material formed in a thickness to prevent the light emitted by the light emitting layer from interfering with the other lights, or a light transmitting material formed to have properties of scattering the light emitted by the light emitting layer, is prepared as a first substrate, and that an electrode, a light emitting layer and an electrode are stacked in this order on a surface of the first substrate,
a step of forming the other of the first and second light emitting units in a manner that a light transparent material is prepared as a second substrate, and that an electrode, a light emitting layer and an electrode are stacked in this order on a surface of the second substrate, and
a step of stacking the first and second light emitting units via the first substrate in a manner that the light emitting unit formed on the second substrate is stacked on the first substrate.

7. A method of manufacturing the organic light emitting element according to claim 1, which includes:
a step of forming one of the first and second light emitting units in a manner that one material of a light transmitting material formed in a thickness to prevent the light emitted by the light emitting layer from interfering with the other lights, or a light transmitting material formed to have properties of scattering the light emitted by the light emitting layer, is prepared as a substrate, and that an electrode, a light emitting layer and an electrode are stacked in this order on a surface of the substrate, and
a step of forming the other of the first and second light emitting units in a manner that an electrode, a light emitting layer and an electrode are stacked in this order on a surface of the substrate without the one of the first and second light emitting units formed thereon.

8. The organic light emitting element according to claim 2, wherein at least one of the first and second light emitting units has a plurality of light emitting layers,
the plurality of light emitting layers being stacked via an equipotential surface forming layer or a charge generation layer.

9. The organic light emitting element according to claim 3, wherein at least one of the first and second light emitting units has a plurality of light emitting layers,
the plurality of light emitting layers being stacked via an equipotential surface forming layer or a charge generation layer.

10. The organic light emitting element according to claim 2, wherein the insulating layer is formed of a glass plate or a film.

11. The organic light emitting element according to claim 3, wherein the insulating layer is formed of a glass plate or a film.

12. A method of manufacturing the organic light emitting element according to claim 2 which includes:
a step of forming one of the first and second light emitting units in a manner that one material of a light transmitting material formed in a thickness to prevent the light emitted by the light emitting layer from interfering with the other lights, or a light transmitting material formed to have properties of scattering the light emitted by the light emitting layer, is prepared as a first substrate, and that an electrode, a light emitting layer and an electrode are stacked in this order on a surface of the first substrate,
a step of forming the other of the first and second light emitting units in a manner that a light transparent material is prepared as a second substrate, and that an electrode, a light emitting layer and an electrode are stacked in this order on a surface of the second substrate, and
a step of stacking the first and second light emitting units via the first substrate in a manner that the light emitting unit formed on the second substrate is stacked on the first substrate.

13. A method of manufacturing the organic light emitting element according to claim 3 which includes:
a step of forming one of the first and second light emitting units in a manner that one material of a light transmitting material formed in a thickness to prevent the light emitted by the light emitting layer from interfering with the other lights, or a light transmitting material formed to have properties of scattering the light emitted by the light emitting layer, is prepared as a first substrate, and that an electrode, a light emitting layer and an electrode are stacked in this order on a surface of the first substrate,
a step of forming the other of the first and second light emitting units in a manner that a light transparent material is prepared as a second substrate, and that an electrode, a light emitting layer and an electrode are stacked in this order on a surface of the second substrate, and
a step of stacking the first and second light emitting units via the first substrate in a manner that the light emitting unit formed on the second substrate is stacked on the first substrate.

14. A method of manufacturing the organic light emitting element according to claim 2, which includes:
a step of forming one of the first and second light emitting units in a manner that one material of a light transmitting material formed in a thickness to prevent the light emitted by the light emitting layer from interfering with the other lights, or a light transmitting material formed to have properties of scattering the light emitted by the light emitting layer, is prepared as a substrate, and that an electrode, a light emitting layer and an electrode are stacked in this order on a surface of the substrate, and
a step of forming the other of the first and second light emitting units in a manner that an electrode, a light emitting layer and an electrode are stacked in this order on a surface of the substrate without the one of the first and second light emitting units formed thereon.

15. A method of manufacturing the organic light emitting element according to claim 3, which includes:
a step of forming one of the first and second light emitting units in a manner that one material of a light transmitting material formed in a thickness to prevent the light emitted by the light emitting layer from interfering with the other lights, or a light transmitting material formed to have properties of scattering the light emitted by the light emitting layer, is prepared as a substrate, and that an electrode, a light emitting layer and an electrode are stacked in this order on a surface of the substrate, and
a step of forming the other of the first and second light emitting units in a manner that an electrode, a light emitting layer and an electrode are stacked in this order on a surface of the substrate without the one of the first and second light emitting units formed thereon.

* * * * *